(12) United States Patent
Burroughes et al.

(10) Patent No.: US 8,115,199 B2
(45) Date of Patent: *Feb. 14, 2012

(54) ELECTROLUMINESCENT DEVICES

(75) Inventors: Jeremy Henley Burroughes, Cambridge (GB); Richard Henry Friend, Cambridge (GB); Christopher John Bright, Huntingdon (GB); David John Lacey, Ashwell (GB); Peter Devine, Cambridge (GB)

(73) Assignee: Cambridge Display Technology Ltd., Cambridge (GB)

( * ) Notice: Subject to any disclaimer, the term of this patent is extended or adjusted under 35 U.S.C. 154(b) by 0 days.

This patent is subject to a terminal disclaimer.

(21) Appl. No.: 12/246,729

(22) Filed: Oct. 7, 2008

(65) Prior Publication Data

US 2009/0096363 A1 Apr. 16, 2009

Related U.S. Application Data

(63) Continuation of application No. 11/398,258, filed on Apr. 5, 2006, now Pat. No. 7,449,714, which is a continuation of application No. 10/682,204, filed on Oct. 10, 2003, now Pat. No. 7,078,251, which is a continuation of application No. 09/508,367, filed as application No. PCT/GB99/00741 on Mar. 12, 1999, now Pat. No. 6,897,473.

(30) Foreign Application Priority Data

Mar. 13, 1998 (GB) .................................. 9805476.0

(51) Int. Cl.
*H01L 35/24* (2006.01)
*H01L 21/00* (2006.01)

(52) U.S. Cl. ..... 257/40; 257/98; 257/103; 257/E33.001; 438/22; 438/29; 438/47

(58) Field of Classification Search .................... 438/28, 438/99, 22, 47; 257/40, 98, E33.001, 103
See application file for complete search history.

(56) References Cited

U.S. PATENT DOCUMENTS 4,539,507 A   9/1985   Van Slyke et al.
(Continued)

FOREIGN PATENT DOCUMENTS

DE   196 27 071 A1   1/1998
(Continued)

OTHER PUBLICATIONS

Office Action in corresponding JP Application 2004-098825, (with English translation of office action), Apr. 7, 2009.

(Continued)

*Primary Examiner* — Michael Trinh
(74) *Attorney, Agent, or Firm* — Rissman Hendricks & Oliverio, LLP

(57) ABSTRACT

An electroluminescent device comprising: a first charge carrier injecting layer for injecting positive charge carriers; a second charge carrier injecting layer for injecting negative charge carriers; and a light-emissive layer located between the charge carrier injecting layers and comprising a mixture of: a first component for accepting positive charge carriers from the first charge carrier injecting layer; a second component for accepting negative charge carriers from the second charge carrier injecting layer; and a third, organic light-emissive component for generating light as a result of combination of charge carriers from the first and second components; at least one of the first, second and third components forming a type II semiconductor interface with another of the first, second and third components.

17 Claims, 26 Drawing Sheets

U.S. PATENT DOCUMENTS

| | | | |
|---|---|---|---|
| 5,281,489 A | 1/1994 | Mori et al. | |
| 5,294,810 A | 3/1994 | Egusa et al. | |
| 5,378,519 A | 1/1995 | Kikuchi et al. | |
| 5,514,878 A | 5/1996 | Holmes et al. | |
| 5,601,903 A | 2/1997 | Fujii et al. | |
| 5,616,427 A * | 4/1997 | Tada | 428/690 |
| 5,670,791 A | 9/1997 | Halls et al. | |
| 5,756,224 A | 5/1998 | Borner et al. | |
| 5,821,690 A | 10/1998 | Martens et al. | |
| 5,834,894 A | 11/1998 | Shirasaki et al. | |
| 5,886,464 A | 3/1999 | Shi et al. | |
| 5,998,045 A | 12/1999 | Chen et al. | |
| 6,376,105 B1 | 4/2002 | Jonas et al. | |
| 6,429,601 B1 | 8/2002 | Friend et al. | |
| 6,441,395 B1 | 8/2002 | Yu et al. | |
| 6,558,219 B1 | 5/2003 | Burroughes et al. | |
| 6,897,473 B1 | 5/2005 | Burroughes et al. | |
| 7,078,251 B2 | 7/2006 | Burroughes et al. | |
| 7,393,704 B2 * | 7/2008 | Burroughes et al. | 438/22 |
| 7,449,714 B2 * | 11/2008 | Burroughes et al. | 257/40 |
| 2001/0026878 A1 | 10/2001 | Woo et al. | |

FOREIGN PATENT DOCUMENTS

| | | |
|---|---|---|
| DE | 196 34 387 A1 | 3/1998 |
| EP | 0532798 A1 | 3/1990 |
| EP | 0643118 A1 | 3/1995 |
| EP | 0774883 A2 | 5/1997 |
| EP | 0805143 A1 | 11/1997 |
| JP | 02-261889 | 10/1990 |
| JP | 03-230584 | 1/1991 |
| JP | 03-114197 | 5/1991 |
| JP | 04-212286 | 8/1992 |
| JP | 04-334894 | 11/1992 |
| JP | 07-85972 | 3/1995 |
| JP | 07-126330 | 5/1995 |
| JP | 04-357694 | 2/1996 |
| JP | 08-41452 | 2/1996 |
| JP | 08-319482 | 12/1996 |
| JP | 09082473 | 3/1997 |
| JP | 2000-252077 | 9/2000 |
| WO | WO 90/13148 | 11/1990 |
| WO | WO 94/03030 | 3/1994 |
| WO | WO 96/20253 | 7/1996 |
| WO | WO 98/05187 A1 | 2/1998 |
| WO | WO 99/20675 | 4/1999 |
| WO | WO 99/48160 | 9/1999 |
| WO | WO 99/54385 | 10/1999 |

OTHER PUBLICATIONS

Bigerson et al., "Efficient Blue-Light Emitting Devices From Conjugated Polymer Blends," Advanced Materials, vol. 8, No. 12, 1996, pp. 982-985.

Cimrova et al., "Blue Light-Emitting Devices Based on Novel Polymer Blends," Advanced Materials, vol. 10, No. 9, 1998, pp. 676-767.

Garten et al., "Efficient Blue LED's From a Partially Conjugates Si-Containing PPV Copolymer in a Double-Layer Configuration," Advanced Materials, vol. 9, No. 2, Feb. 1, 1997, pp. 127-131, XP000681979.

Greenham et al., "Electroluminescence from multilayer conjugated polymer devices—spatial control of exciton formation and emission," SPIE, vol. 1910, pp. 111-119.

Halls et al., "Efficient Photodiodes From Interpenetrating Polymer Networks," Letters to Nature, vol. 376, Aug. 10, 1995, pp. 498-500.

Hosokawa et al., "Highly Efficient Blue Electroluminescent From a Distyrylarylene Emitting Layer With a New Dopant," Applied Physics Letters, vol. 67, No. 26, Dec. 25, 1995, pp. 3853-3855, XP000548843.

Sacilotti et al., "Porous Silicon Photoluminescence: Type II-Like Recombination Mechanism," Electronics Letters, Apr. 29, 1993, vol. 29, No. 9, pp. 790-791.

Yang et al., "Poly(1,4-Phenylene-1,2-diphenylvinylene) and Tris (8-Quinolinolato) Aluminum Bilayer Light-Emitting Diodes," Polymers for Advanced Technologies, vol. 8, No. 7, Jul. 1, 1997, pp. 431-436, XP000695524.

Zhonghua et al., "Oxadiazole-Containing Conjugated Polymers for Light-Emitting Diodes," Advanced Materials, vol. 10, No. 9, 1998, pp. 680-684.

Search Report from the UK Patent Office, dated Jun. 5, 1998, in corresponding Application No. GB 9805476.0.

International Search Report mailed Jul. 15, 1999, in corresponding PCT Application No. PCT/GB99/00741.

Office Action from the Japanese Patent Office (English translation) dated Sep. 30, 2003 in Application No. 2000-537271 with correlation of references cited in Office Action (English abstracts and translations).

European Search Report in corresponding EP Application No. 06075642.6—2203/1672719 dated Sep. 22, 2009.

Li X-C et al, "Synthesis and Properties of Novel High-Electron-Affinity Polymers for Electroluminescent Devices" Water-Soluble Polymers: Synthesis Solution Properties and Applications, American Chemical Society, Washington, DC, vol. 672, Jan. 1, 1997, pp. 322-344.

* cited by examiner

ELECTROLUMINESCENT DEVICES

RELATED APPLICATIONS

This is a continuation of U.S. Ser. No. 11/398,258, filed Apr. 5, 2006 (now U.S. Pat. No. 7,449,714), which is a continuation of U.S. Ser. No. 10/682,204, filed Oct. 10, 2003, (now U.S. Pat. No. 7,078,251), which is a continuation of U.S. Ser. No. 09/508,367 filed Jan. 3, 2002 (now U.S. Pat. No. 6,897,473), which is a 371 of PCT/GB99/00741, filed Mar. 12, 1999, which claims the benefit of priority of GB 9805476.0, filed Mar. 13, 1998, all of which are incorporated herein by reference in their entirety.

FIELD OF THE INVENTION

This invention relates to electroluminescent devices, especially those that employ an organic material for light emission.

BACKGROUND OF THE INVENTION

Electroluminescent devices that employ an organic material for light emission are described in PCT/WO90/13148 and U.S. Pat. No. 4,539,507, the contents of both of which are incorporated herein by reference. The basic structure of these devices is a light-emissive organic layer, for instance a film of a poly(p-phenylenevinylene) ("PPV"), sandwiched between two electrodes. One of the electrodes (the cathode) injects negative charge carriers (electrons) and the other electrode (the anode) injects positive charge carriers (holes). The electrons and holes combine in the organic layer generating photons. In PCT/WO90/13148 the organic light-emissive material is a polymer. In U.S. Pat. No. 4,539,507 the organic light-emissive material is of the class known as small molecule materials, such as (8-hydroxyquinolino)aluminium ("Alq"). In a practical device, one of the electrodes is typically transparent, to allow the photons to escape the device.

These devices have great potential for displays. However, there are several significant problems. One is to make the device efficient, particularly as measured by its power efficiency and its external efficiency. Another is to reduce the voltage at which peak efficiency is obtained.

As a preliminary point, it should be noted that the values stated here for energy levels, workfunctions etc. are generally illustrative rather than absolute. The workfunction of ITO can vary widely. Numbers quoted in the literature suggest a range between 4 and 5.2 eV. The 4.8 eV value used here serves as an illustrative rather than an absolute value. The applicant has carried out Kelvin probe measurements which suggest that 4.8 eV is a reasonable value. However, it is well known that the actual value can depend on ITO deposition process and history. For organic semiconductors important characteristics are the binding energies, measured with respect to the vacuum level of the electronic energy levels, particularly the "highest occupied molecular orbital" ("HOMO") and "lowest unoccupied molecular orbital" ("LUMO") levels. These can be estimated from measurements of photoemission and particularly measurements of the electrochemical potentials for oxidation and reduction. It is well understood in the field that such energies are affected by a number of factors, such as the local environment near an interface, and is the point on the curve (peak) from which the value is determined—e.g. peak, peak base, half-way point—so the use of such values is indicative rather than quantitative. However, the relative values are significant.

FIG. 1a shows a cross section of a typical device for emitting green light. FIG. 1b shows the energy levels across the device. The anode 1 is a layer of transparent indium-tin oxide ("ITO") with a workfunction of 4.8 eV. The cathode 2 is a LiAl layer of with a workfunction of 2.4 eV. Between the electrodes is a light-emissive layer 3 of PPV, having a LUMO energy level 5 at around 2.7 eV and a HOMO energy level 6 at around 5.2 eV. Holes and electrons that are injected into the device recombine radiatively in the PPV layer. A helpful but not essential feature of the device is the hole transport layer 4 of doped polyethylene dioxythiophene ("PEDOT") (see EP 0 686 662 and Bayer AG's Provisional Product Information Sheet for Trial Product Al 4071). This provides an intermediate energy level at 4.8 eV, which helps the holes injected from the ITO to reach the HOMO level in the PPV.

Other organic light-emissive materials, having different optical gaps, can take the place of the PPV in order to generate light of other colours. However, at larger optical gaps, towards the blue end of the visible spectrum, the HOMO level is generally well below the corresponding energy level of the TO. This makes it difficult to inject holes into the emissive layer, i.e. high electric fields are required in order to encourage holes to inject into the semiconductor layer. One solution to this problem would be to choose another material for the anode, but it is difficult to find a preferable alternative because ITO has good transparency, low sheet resistance and established processing routes. Another solution is to add further hole transport layers, so as to provide a series of intermediate energy steps between the anode and the emissive layer. However, where the layers are deposited from solution it is difficult to avoid one layer being disrupted when the next is deposited, and problems can arise with voids or material trapped between the increased number of inter-layer boundaries.

Considerable advantages can be had from using a plurality of organic semiconductors within a diode structure; critical to the functioning of such structures is the nature of the interface electronic structure between any two components in contact with one another. A common starting point for such descriptions is that well-known for heterojunctions formed in epitaxially-grown III-V semiconductors. Heterojunctions are classified into classes which include: type I, in which the LUMO and HOMO levels of one material (material A) lie within the LUMO-HOMO energy gap of the second material (material B), as illustrated in FIG. 2a, and type II, in which the minimum energy difference between the highest HOMO state and the lowest LUMO state is between levels on different sides of the heterojunction, as illustrated in FIG. 2b. It is generally considered that an electron-hole pair that is in the immediate vicinity of such heterojunctions will arrange so that the electron occupies the lowest LUMO level, and the hole occupies the highest HOMO level. Thus, the electron and hole are present on the same side of the junction for a type I heterojunction, but are separated for the type II heterojunction. An important consequence of this is that electron-hole capture and subsequent light emission is expected for type I but not for type II heterojunctions.

There have been some attempts to combine components in blue-emissive layers. In "Highly Efficient Blue Electroluminescence from a Distyrylarylene Emitting Layer with a new Dopant", Hosokawa et al., Appl. Phys. Lett. 67 (26), 25 Dec. 1995, pp 3853-5 a small molecule device has an emissive layer in which DPVBi is blended with BCzVB or BczVBi. The dopants have a slightly smaller bandgap and a displaced HOMO position compared to the host material. The observed light emission is only from the dopant. This is explained by the authors as arising from Förster energy transfer due to the smaller energy of an exciton on the dopant molecules. "Efficient Blue-Light Emitting Devices from Conjugated Polymer Blends", Birgerson et al., Adv. Mater. 1996, 8, No. 12, pp 982-5 describes a blue-light emitting device which employs conjugated polymer blends. The emissive layer of the device consists of a blend of PDHPT with PDPP. These materials form a type I semiconductor interface (see FIG. 2a), so light emission is from the PDHPT alone. The paper emphasises that "it is a necessary but not sufficient requirement that the HOMO-LUMO gap of the light-emitting (guest) polymer be smaller than that of the host polymer. An additional condition is that . . . the HOMO energy level of the guest polymer must be at a lower binding energy than that of the host polymer, and the LUMO energy level of the guest polymer must be at a higher binding energy than that of the host polymer". Other devices having type I interfaces at the emissive layer are described in EP 0 532 798 A1 (Mori et al.) and U.S. Pat. No. 5,378,519 (Kikuchi et al.).

Two-layer EL devices which exploit the high electron affinity of cyano-derivatives of PPV have shown high efficiencies, as described in U.S. Pat. No. 5,514,878. However, when mixtures are formed with CN-PPV and the soluble PPV, MEH-PPV, as described in "Efficient Photodiodes from Interpenetrating Polymer Networks", J J M Halls et al., Nature, Vol. 376, 10 August 1995, pp 498-500 and U.S. Pat. No. 5,670,791, strong quenching of luminescence is observed.

"Oxadiazole-Containing Conjugated Polymers for Light-Emitting Diodes", Peng et al., Adv. Mater. 1998, 10, No. 9 describes a light-emitting device in which the emissive layer comprises an oxadiazole-containing PPV polymer. The oxadiazole is present to aid electron transport. It is noted that "the PPV segment can function as both the hole transporter and the emitter".

In "Efficient Blue LEDs from a Partially Conjugated Si-Containing PPV Copolymer in a Double-Layer Configuration", Garten et al., Adv. Mater., 1997, 9, No. 2, pp 127-131 a light-emissive device has an emissive layer in which Si-PPV is diluted with PVK to reduce aggregation. The photoluminescent efficiency of the device is observed to increase when aggregation is reduced.

"Blue Light-Emitting Devices Based on Novel Polymer Blends", Cimrová et al., Adv. Mater. 1998, 10, No. 9 describes light-emitting devices whose emitting layers comprise a blend of two polymers having "almost identical HOMO levels".

SUMMARY OF THE INVENTION

According to a first aspect of the present invention there is provided an electroluminescent device comprising: a first charge carrier injecting layer for injecting positive charge carriers; a second charge carrier injecting layer for injecting negative charge carriers; and a light-emissive layer located between the charge carrier injecting layers and comprising a mixture of: a first component for accepting positive charge carriers from the first charge carrier injecting layer; a second component for accepting negative charge carriers from the second charge carrier injecting layer; and a third, organic light-emissive component for generating light as a result of combination of charge carriers from the first and second components; at least one of the first, second and third components forming a type II semiconductor interface with another of the first, second and third components.

The process of accepting and combining charge carriers may include acceptance of an exciton from another component and/or acceptance of separate positive and negative charge carriers which subsequently form an exciton.

Preferably one or all of the said components of the light-emissive layer is/are phase separated to some extent (e.g. partially or fully) in the light-emissive layer. The light-emissive layer suitably comprises regions of each of the said components, which are preferably dispersed through the light-emissive layer. Each of those regions suitably comprises substantially only one of the said components, and preferably has the electronic characteristics provided by that component. The components may be evenly or unevenly distributed in the light-emissive layer. One or more of the components may be concentrated near the interfaces of the light-emissive layer with the first or second charge carrier injecting layer. The concentration may be such that near that interface that component is substantially undiluted by another component of the mixture. Thus, that component may suitably approach or reach full concentration at that interface. It is preferred that near the interface with the first charge carrier injecting layer there is a greater concentration of the first component than in the central region of the light-emissive layer and/or near the interface with the second charge carrier injecting layer. It is preferred that near the interface with the second charge carrier injecting layer there is a greater concentration of the second component than in the central region of the light-emissive layer and/or near the interface with the first charge carrier injecting layer. The concentration of the first component in the light-emissive layer may increase towards the first charge carrier injecting layer. The concentration of the second component in the light-emissive layer may increase towards the second charge carrier injecting layer.

The layer on to which the light-emissive layer is deposited may be treated in order to influence the said concentrations. If the light-emissive layer is deposited directly or indirectly on to the first injecting layer then the first layer may be treated to encourage a greater concentration of the first component near it. If the light-emissive layer is deposited directly or indirectly on to the second injecting layer then the second layer may be treated to encourage a greater concentration of the second component near it. The treatment could, for example, be surface modification (e.g. the application of an oxygen plasma) or depositing of another layer of a material, for example a material for which the first component has a greater affinity than does the second component or for which the second component has a greater affinity than does the first component. That material may be or comprise the first component or the second component. The surface modification suitably affects the surface free energy of the surface on to which the light-emissive layer is to be deposited.

Two or more of the components of the emissive layer may be provided as functional chemical units or moieties of a single molecule. Any further components of the layer may be provided by one or more further molecules physically mixed with the said single molecule. Alternatively, all the components of the emissive layer may be provided by respective different molecules physically mixed together. Where a single molecule provides more than one component those components could be combined as a copolymer (e.g. in main chain, side chain, block or random form). One or more of the components could be provided as a pendant group of a polymer chain of another one or more of the components. Where a single molecule provides more than one component the components provided by that molecule preferably include the third component. Suitably the third component and at least one of the first and second components are provided as a copolymer. Suitably the third component is provided as a pendant group of a polymer chain of the first and/or second components. Suitably the first and/or second components are provided as one or more pendant groups of a polymer chain of the third component.

The light-emissive layer is preferably formed by deposition of the first, second and third components together. Preferably all the components of the emissive layer are soluble, and most preferably all are soluble in the same solvent or in the same solvent mixture. This may permit the components to be conveniently co-deposited from solution. The light-emissive layer may comprise two or more sub-layers each comprising the first, second and third components.

Preferably one or more of the first, second and third components forms a type II semiconductor interface with another of the first, second and third components. A distinction can be made between type II interfaces which do not lead to charge separation (which may be referred to a "luminescent type II interfaces") and those that do lead to charge separation and which, by this or another mechanism, tend to quench luminescence ("non-luminescent type II interfaces"). The type II interfaces referred to herein are suitably of the luminescent type. Luminescent and non-luminescent interfaces can easily be characterised by forming suitable interfaces (as bi-layers or as mixtures formed from solution) and measuring their luminescence behaviour under optical excitation. Methods for measuring the absolute luminescence efficiency are referred to in the paper by Halls et al. cited above.

The applicant considers that it might be possible to understand the underlying principles which govern the behaviour of such type II interfaces by taking into account the role of the binding energy between electron and hole when formed as the neutral excited electronic state (exciton). This "exciton binding energy" is in part due to the electrostatic attraction between electron and hole, and seems to be much stronger in the molecular and polymeric semiconductors—which are preferred for use in embodiments of the present invention as providing one or more of the first, second and third components—than in inorganic semiconductors such as III-V materials. The exciton binding energy may act to keep both electron and hole on the same side of a heterojunction. Therefore, in order to achieve charge separation, the energy offsets at the heterojunction as illustrated for the type II case in FIG. 2b) between HOMO and LUMO (as appropriate) levels may be preferred to be greater than the exciton binding energy.

Most preferably all of the first, second and third components form type II semiconductor interfaces with the others of the first, second and third components. The first component may form a type II semiconductor interface with the second component. The second component may form a type II semiconductor interface with the third component. The first component may form a type II semiconductor interface with the third component. As explained above, any or all these are suitably "luminescent type II interfaces". One potential physical structure of such an interface may be that it is a type II interface in which it is more energetically favourable for an exciton to form on one of the components (preferably but not necessarily a luminescent component) than for an electron/hole pair to dissociate onto separate components. This will normally be due to there being a relatively small offset between the HOMO and/or LUMO levels of components of the device. In many preferred practical situations this will be due to the energy gap between the HOMO level of one component and that of another component having a lower HOMO level less than the binding energy of an exciton on that said one component. In such a system electrons may be injected to the lower HOMO level of the said other component and holes to the higher LUMO level of the said one component. However, it can be energetically efficient for the electron and hole to combine to form an exciton on the said one component. Thus advantage may be had from efficient injection at the said lower HOMO and higher LUMO levels (allowing a greater choice of materials for electrodes of device) whilst maintaining emission from the device. The applicant has found that this effect can lead to a remarkable increase in the efficiency of a light emissive device.

The light-emissive layer may comprise other materials, or may consist (or essentially consist) of the first, second and third components, together optionally with any impurities.

The third component is preferably a material that is emissive in the visible (e.g. the red, green or blue) and/or near infrared and/or near ultraviolet regions of the spectrum. The optical gap of the third component is preferably greater than 1.8 eV. When the device is in use there is preferably no (or substantially no) emission from the first and second components. The third component may suitably have an optical gap smaller than the optical gaps of the first and second components. The "optical gap" of a material may be measured as the photon energy at which the material exhibits strong optical absorption. The third material is preferably a highly efficient luminescent material.

In some circumstances it may be advantageous for the first component to have a LUMO energy level between the LUMO energy levels of the second and third components, suitably to assist the movement of negative charge carriers between the second and third components. The first component suitably has a HOMO energy level between the HOMO energy levels of the second and third components, suitably to assist the movement of positive charge carriers to the second and/or the third components. The first component suitably has a HOMO energy level greater than or equal to the energy level of the first charge injecting layer.

The first, second and third components may each be an organic material, suitably a polymer, preferably a conjugated or partially conjugated polymer. Suitable materials include PPV, poly(2-methoxy-5(2'-ethyl)hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related co-polymers. The first and second components (in addition to the third component) may be of light-emissive materials. The first component is suitably a conjugated polymer capable of accepting positive charge carriers from the first charge carrier injecting layer and containing amine groups in the main chain and/or as pendant groups. Alternative materials include organic molecular light-emitting materials, e.g. $Alq_3$, or any other small sublimed molecule or conjugated polymer electroluminescent material as known in the prior art. The first component may be poly(2,7-(9,9-di-n-octylfluorene)-(1,4-phenylene-((4-secbutylphenyl)imino)-1,4-phenylene)) ("TFB"). The second component may be poly(2,7-(9,9-di-n-octylfluorene) ("F8"). The third component may be poly(2,7-(9,9-di-n-octylfluorene)-(1,4-phenylene-((4-methylphenyl)imino)-1,4-phenylene-((4-methylphenyl)imino)-1,4-phenylene)) ("PFM"), poly(2,7-(9,9-di-n -octylfluorene)-(1,4-phenylene-((4-methoxyphenyl)imino)-1,4-phenylene-((4-methoxyphenyl)imino)-1,4-phenylene)) ("PFMO") or poly(2,7-(9,9-di-n-octylfluorene)-3,6-Benzothiadiazole) ("F8BT"). (See FIG. 3). The third component may be a soluble PPV. Other materials could be used.

The first charge carrier injecting layer may be a positive charge carrier transport layer which is located between the light-emissive layer and an anode electrode layer, or may be an anode electrode layer. The second charge carrier injecting layer may be a negative charge carrier transport layer which is located between the light-emissive layer and a cathode electrode layer, or may be a cathode electrode layer. Any electrode layer and/or charge transport layer is suitably light transmissive, and preferably transparent, suitably at the frequency of light emission from the device.

The anode electrode layer suitably has a workfunction greater than 4.0 eV. The cathode electrode layer suitably has a workfunction less than 3.5 eV.

According to a second aspect of the present invention there is provided an electroluminescent device comprising: a first charge carrier injecting layer for injecting positive charge carriers; a second charge carrier injecting layer for injecting negative charge carriers; and a light-emissive layer located between the charge carrier injecting layers and comprising a mixture of: a first organic light-emissive component for accepting and combining positive charge carriers from the first charge carrier injecting layer and negative charge carriers from the second light-emissive component to generate light; a second organic light-emissive component for accepting and combining negative charge carriers from the second charge carrier injecting layer and positive charge carriers from the first light-emissive component to generate light; the first and second components forming a type II semiconductor interface with each other.

The said type II semiconductor interface is preferably a luminescent type II interface.

The said components of the light-emissive layer may be phase separated to some extent (e.g. partially or fully) in the light-emissive layer. The light-emissive layer suitably comprises regions of each of the said components, which are preferably dispersed through the light-emissive layer. Each of those regions suitably comprises substantially only one of the said components, and preferably has the electronic characteristics provided by that component. The components may be evenly or unevenly distributed in the light-emissive layer. One of the components may be concentrated near one or both of the interfaces of the light-emissive layer with the first or second charge carrier injecting layer. That component is preferably the first component. The concentration of that component may be such that near one or both of those interfaces it is substantially undiluted by the other component of the mixture. Thus, that component may suitably approach or reach full concentration at one or both of those that interfaces.

The components of the emissive layer may be provided as functional chemical units or moieties of a single molecule, or as a physically mixture or different molecules. Where a single molecule provides more than one component those components could be combined as a copolymer (e.g. in main chain, side chain, block or random form). One of the components (either the first component or the second component) could be provided as a pendant group of a polymer chain of the other component (ether the second component or the first component).

Preferably both the components of the emissive layer are soluble, and most preferably both are soluble in the same solvent or in the same solvent mixture. This may permit the components to be conveniently co-deposited from solution.

The first component suitably has a HOMO energy level above that of the second component. The second component suitably has a LUMO energy level above that of the third component.

The light-emissive layer may comprise other materials, or may consist (or essentially consist) of the first and second components, together optionally with any impurities.

Either or both of the first and second components are preferably materials that are emissive in the visible (e.g. the red, green or blue) and/or near infrared and/or near ultraviolet regions of the spectrum. The optical gap of either or both of the first and second components is preferably greater than 1.8 eV.

The first and second components may each be an organic material, suitably a polymer, preferably a conjugated or partially conjugated polymer. Suitable materials include PPV, poly(2-methoxy-5(2'-ethyl)hexyloxyphenylene-vinylene) ("MEH-PPV"), a PPV-derivative (e.g. a di-alkoxy or di-alkyl derivative), a polyfluorene and/or a co-polymer incorporating polyfluorene segments, PPVs and/or related co-polymers. Alternative materials include organic molecular light-emitting materials, e.g. $Alq_3$, or any other small sublimed molecule or conjugated polymer electroluminescent material as known in the prior art. The second component may, for example, be F8 or a porphyrin. The first component may, for example, be TFB. The first component could be a conjugated polymer capable of accepting positive charge carriers from the first charge carrier injecting layer and containing amine groups in the main chain and/or as pendant groups. Other materials could be used.

The first charge carrier injecting layer may be a positive charge carrier transport layer which is located between the light-emissive layer and an anode electrode layer, or may be an anode electrode layer. The second charge carrier injecting layer may be a negative charge carrier transport layer which is located between the light-emissive layer and a cathode electrode layer, or may be a cathode electrode layer. Any electrode layer and/or charge transport layer is suitably light transmissive, and preferably transparent, suitably at the frequency of light emission from the device.

The anode electrode layer suitably has a workfunction greater than 4.0 eV. The cathode electrode layer suitably has a workfunction less than 3.0 eV.

According to a third aspect of the present invention there is provided an electroluminescent device comprising: a first charge carrier injecting layer for injecting positive charge carriers; a second charge carrier injecting layer for injecting negative charge carriers; an organic light-emissive layer located between the charge carrier injecting layers; and an organic charge transport layer located between the light-emissive layer and one of the charge carrier injecting layers, wherein the heterojunction formed between the transport layer and the light-emissive layer is a luminescent type II heterojunction.

According to a fourth aspect of the present invention there is provided a method for forming an electroluminescent device, comprising: depositing a first charge carrier injecting layer for injecting charge carriers of a first polarity; depositing a light-emissive layer over the first charge carrier injecting layer, the light-emissive layer comprising a mixture of: a first component for accepting charge carriers from the first charge carrier injecting layer; a second component for accepting charge carriers of the opposite polarity from a second charge carrier injecting layer; and a third, organic light-emissive component for generating light as a result of combination of charge carriers from the first and second components; at least one of the first, second and third components forming a type II semiconductor interface with another of the first, second and third components; and depositing the second charge carrier injecting layer over the light-emissive layer for injecting charge carriers of the said opposite polarity.

According to a fifth aspect of the present invention there is provided a method for forming an electroluminescent device, comprising: depositing a first charge carrier injecting layer for injecting charge carriers of a first polarity; depositing a light-emissive layer comprising a mixture of: a first organic light-emissive component for accepting and combining charge carriers of the first polarity from the first charge carrier injecting layer and charge carriers of the other polarity from a second light-emissive component to generate light; and the second organic light-emissive component for accepting and combining charge carriers of the said opposite polarity from the second charge carrier injecting layer and charge carriers of the first polarity from the first light-emissive component to generate light; the first and second components forming a type II semiconductor interface with each other; and depositing the second charge carrier injecting layer for injecting charge carriers of the said opposite polarity.

In the fourth and fifth aspects of the invention the first, second and (where present) third components are preferably deposited together. The said first polarity is preferably positive, but could be negative. The said opposite polarity is preferably negative, but could be positive. The said methods preferably comprise the step of treating the first charge carrier injecting layer prior to deposition of the light-emissive layer to influence the phase structure of the light-emissive layer. This may be to encourage a greater concentration of the first component near the first charge carrier injecting layer.

For all aspects of the present invention it is preferred that the applied voltage at which the device has maximum power efficiency or external efficiency is below 10 V, preferably below 7 V and most preferably below 4 V. For both aspects of the invention it is preferred that the device has a peak power efficiency equivalent to devices emitting in the green of greater than 1 lm/W, preferably greater than 2 lm/W and most preferably greater than 6 lm/W. For both aspects of the invention it is preferred that the device has a peak external efficiency equivalent to devices emitting in the green of greater than 2 Cd/A, preferably greater than 5 Cd/A and preferably greater than 7 Cd/A.

For all aspects of the present invention it is preferred that the thickness of the emissive layer is below 400 nm, and most preferably in the range from 40 to 160 nm.

An aspect important to appreciation of the present invention, as further developed below, is that the conventional description of heterojunctions does not generally apply for the molecular and polymeric semiconductors which are described here. In particular, although type II heterojunctions are sometimes effective at charge separation (with no light emission), it has been found that there are important circumstances when they are capable of providing efficient emission of light. As illustrated below, this possibility for the desirable properties of a "type II" heterojunction is not recognised in the prior art known to the applicant. Furthermore, there is no prior art known to the applicant which leads to the realisation of EL diodes which contain type II junctions and which shows reduced operating voltages by virtue of the presence of the several semiconductor components present.

A device according to the present invention may have a photoluminescence efficiency that is not substantially less than the photoluminescence efficiency of the emissive component of the emissive layer (e.g. the third component) in unblended form. That photoluminescence efficiency may suitably greater than 30%.

BRIEF DESCRIPTION OF THE DRAWINGS

The present invention will now be described by way of example with reference to the accompanying drawings, in which:

FIG. 1b shows the energy levels across the device of FIG. 1a;

DETAILED DESCRIPTION

Table 1 gives material properties of some light-emissive materials:

TABLE 1

| Material | % PL Efficiency [1] | % PL Efficiency [2] | HOMO Level (eV) | LUMO Level (eV) | Optical gap (eV) | Emission Colour |
|---|---|---|---|---|---|---|
| F8 | 80 | 50 | 5.8 | 2.8 | 3.0 | Blue |
| F8BT |  | 80 | 5.9 | 3.3 | 2.4 | Green |
| TFB | 40 | 15 | 5.3 | 2.3 | 3.0 | Blue |
| PFMO | 40 | 13 | 5.0 | 2.0 | 3.0 | Blue |
| PFM | 20 | 5 | 5.0 | 2.1 | 2.9 | Blue |
| 5F8BT | 95 | 55 | 5.9 | 3.5 | 2.4 | Green |
| Bis-DMOS PPV |  |  | 5.7 | 3.5 | 2.2 | Green |
| PPV A [3] |  |  | 5.6 | 3.2 | 2.6 | Green |

Notes to table 1:
[1] Photoluminescence (PL) efficiencies measured using the technique of Halls et al. (see above).
[2] Measured using a refined technique based on that of Halls et al.
[3] See discussion of FIG. 25 below.

The HOMO positions were estimated from electrochemical measurement. The optical gaps were determined from the UV/visible absorbance spectrum. The LUMO positions were estimated from the HOMO position and the optical gap. 5F8BT is an abbreviation for a blend of 5% F8BT with 95% F8 w/w.

Figure 4:
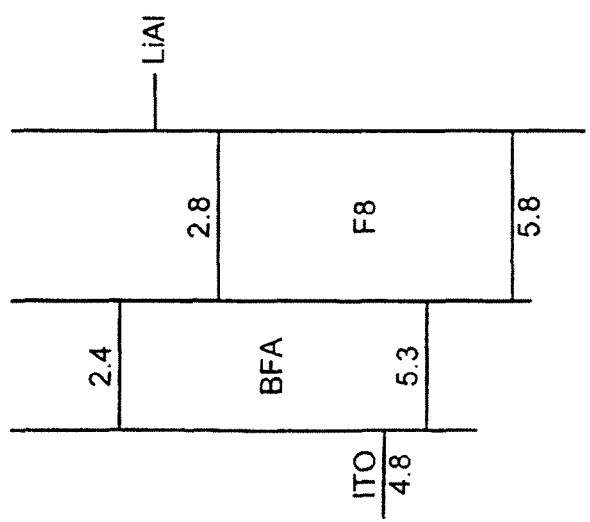
FIG. 4 is a band diagram for an electroluminescent device.
Figure 5:
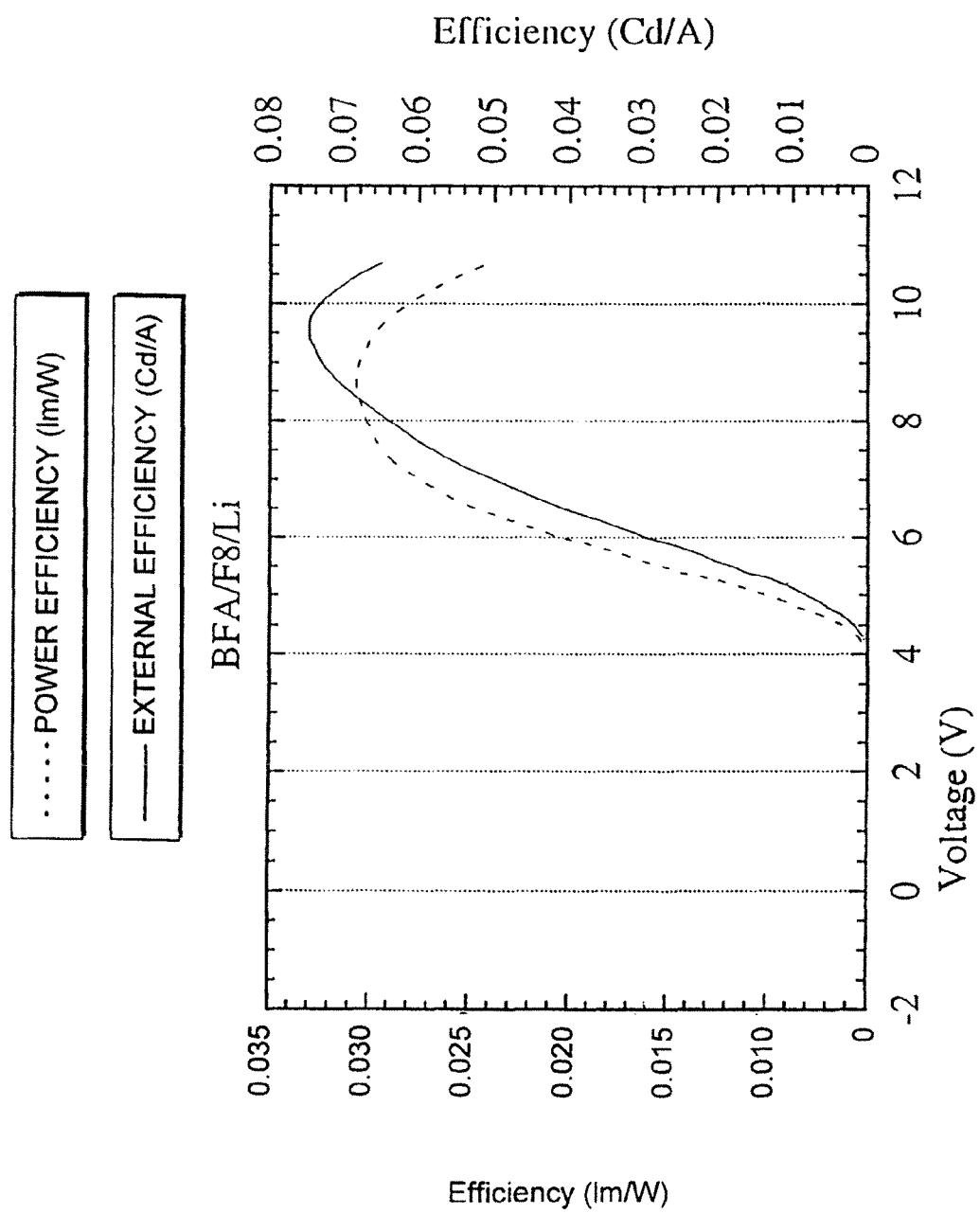
FIG. 5 is a graph plotting the efficiency of the device of FIG. 4 against voltage.

Of the blue emitters, F8 has the highest PL efficiency of these materials. Therefore, of these materials it would normally be the material of choice for a blue emissive layer. FIG. 4 is a band diagram for a device in which the emissive layer is F8. A layer of poly(2,7-(9,9-di-n-octylfluorene)-(1,4-phenylene-(4-imino(benzoic acid))-1,4-phenylene-(4-imino(benzoic acid))-1,4-phenylene)) ("BFA") is included as an intermediate hole transport layer. Alternatives for BFA are PEDOT-PSS (polyethylene dioxythiophene doped with polystyrene-sulphonate to modify its conductivity—available from Bayer AG and described in UK patent application number 9703172.8), polyaniline, PVK etc. The hole transport layer also serves to block the passage of electrons to the anode. There is a type II semiconductor interface between the BFA and the F8. FIG. 5 shows the power efficiency and the external efficiency of the device against drive voltage. Because of the deep HOMO level (5.8 eV) of the F8 relative to the corresponding energy level in the ITO (4.8 eV) the device needs a high drive voltage and has low power efficiency, even with the intermediate layer of BFA. The power efficiency peaks at about 0.03 lm/W, which is well below what would be acceptable in a practical device. And because the power efficiency is low there is severe heating in the device and its lifetime is short (a matter of minutes). Even during the measurement period for the data for FIG. 5 it was found that the device suffered rapid decay, believed to be due to recrystallisation resulting from heating. This causes a shift in the emission spectrum of the device, with lower energy emissions increasing relative to high energy emissions.

Figure 6:
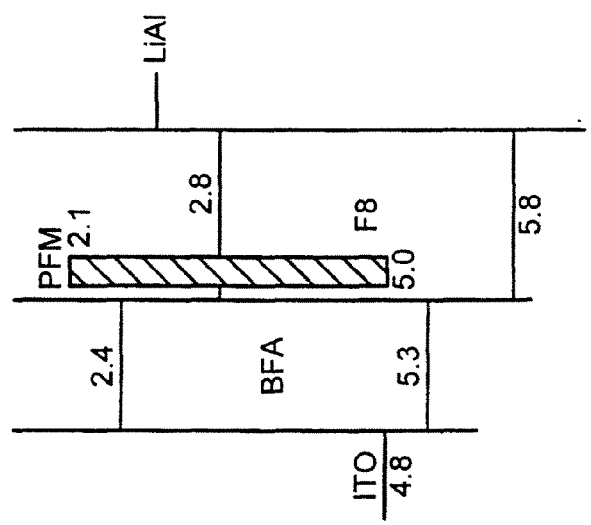
FIG. 6 is a band diagram for a second electroluminescent device.

FIG. 6 is a band diagram for a second device, in which the emissive layer is 84% F8 mixed with 16% PFM. A layer of BFA is again included as an intermediate hole transport layer. There are type II semiconductor interfaces between the BFA and the F8, the BFA and the PFM, and the PFM and the F8.

Figure 7:
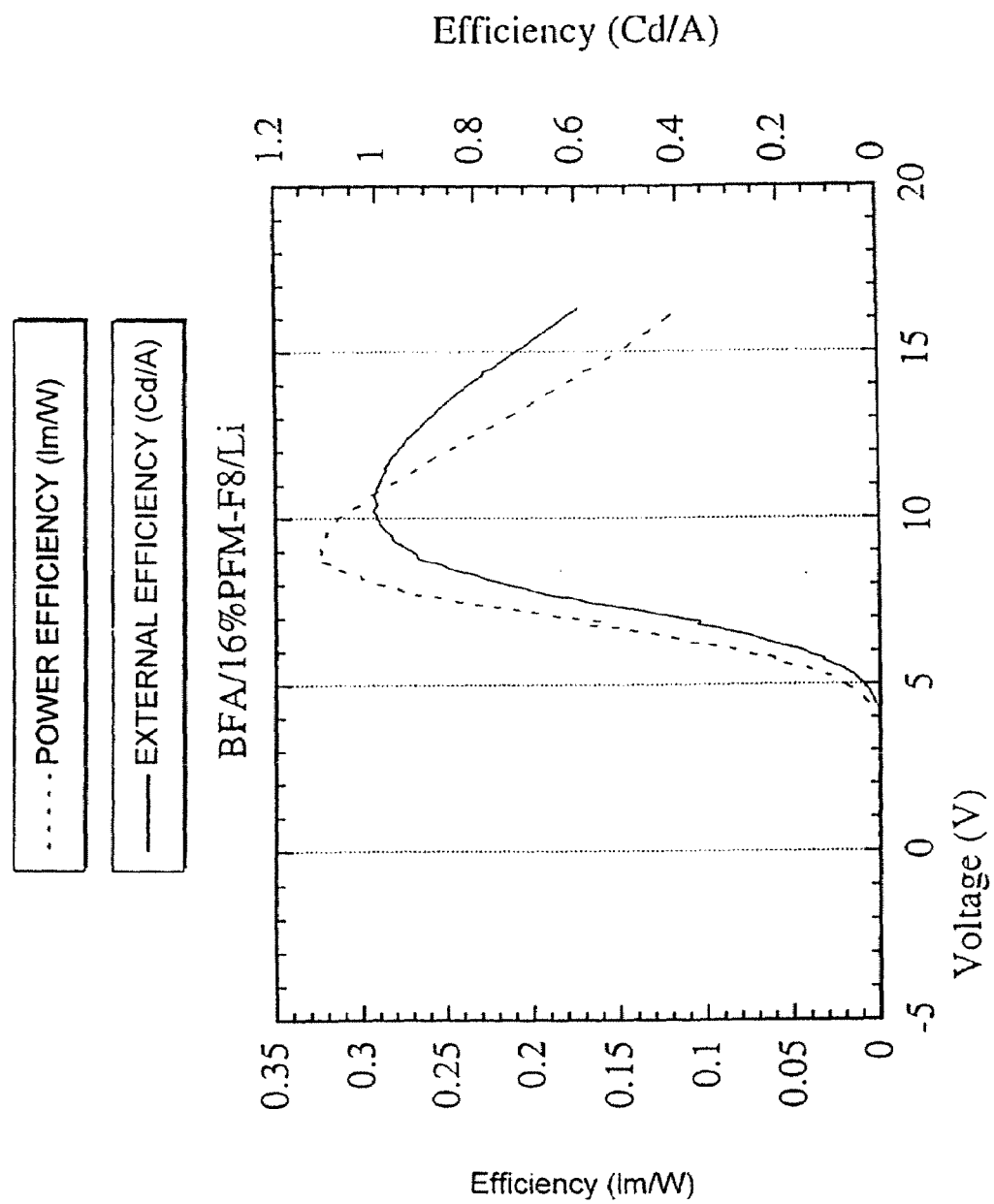
FIG. 7 is a graph plotting the efficiency of the device of FIG. 6 against voltage.
Figure 8:
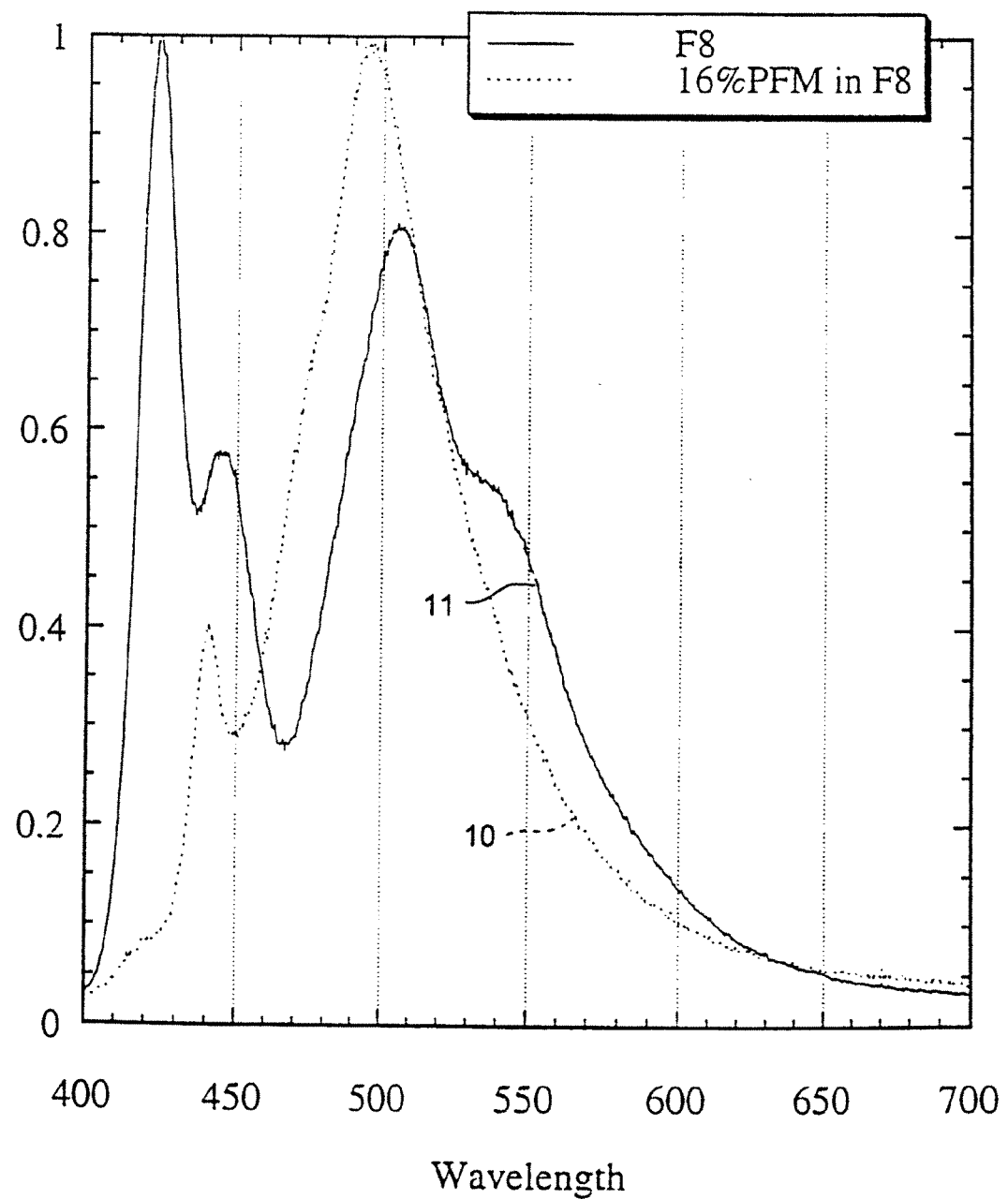
FIG. 8 shows the emission spectrum of the device of FIG. 6.

FIG. 7 shows the power efficiency and the external efficiency of the device against drive voltage. Compared to the device of FIGS. 4 and 5 the peak power efficiency of this device is increased (0.33 lm/W compared to 0.03 lm/W), but the voltage at which the power efficiency peaks is not reduced. This suggests that in this device holes are injected into the F8 host polymer (as in the device of FIGS. 4 and 5) and then localised on PFM segments. FIG. 8 shows the emission spectrum from the device (line 10) compared to the spectrum of F8 (line 11). FIG. 8 indicates that sufficient recombination does occur on the F8 to suggest that holes are injected into the F8 from the hole transport layer of BFA, but shows that most of the recombination of holes and electrons occurs on the PFM rather than the F8. Thus, localised holes form electron-hole pairs with reasonable probability that the electron can be excited to the PFM region. The peak external efficiency of this device (see FIG. 7) is around 1 Cd/A which is around a factor of 10 better than the device of FIGS. 4 and 5.

Figure 1A:
FIG. 1a shows a cross section of a typical electroluminescent device for emitting green light.
Figure 1B:
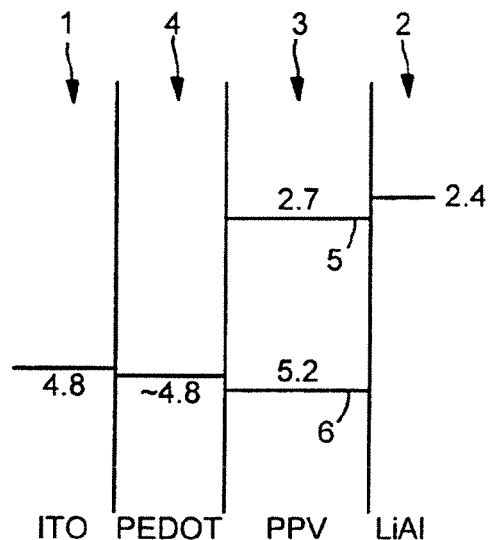
Figure 2A:
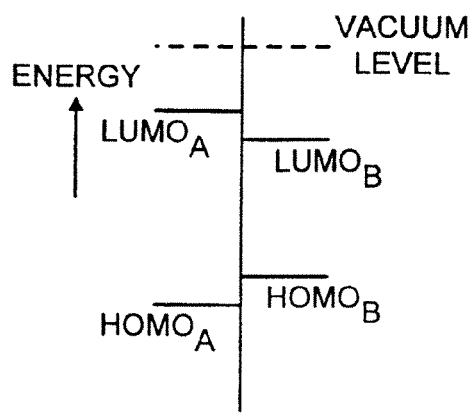
FIG. 2a is an energy band diagram for a heterojunction of type I, in which the LUMO and HOMO levels of one material lie within the LUMO-HOMO energy gap of the second material.
Figure 2B:
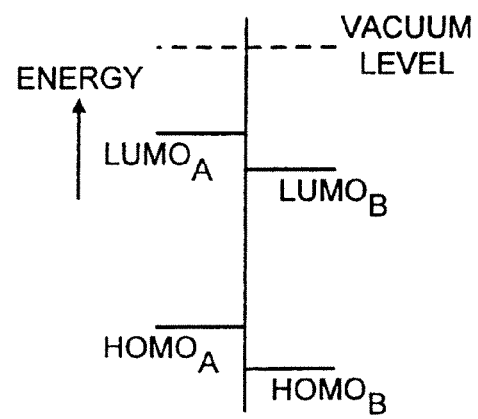
FIG. 2b is an energy band diagram for a heterojunction of type II, in which the minimum energy difference between the highest HOMO state and the lowest LUMO state is between levels on different sides of the heterojunction.
Figure 3:
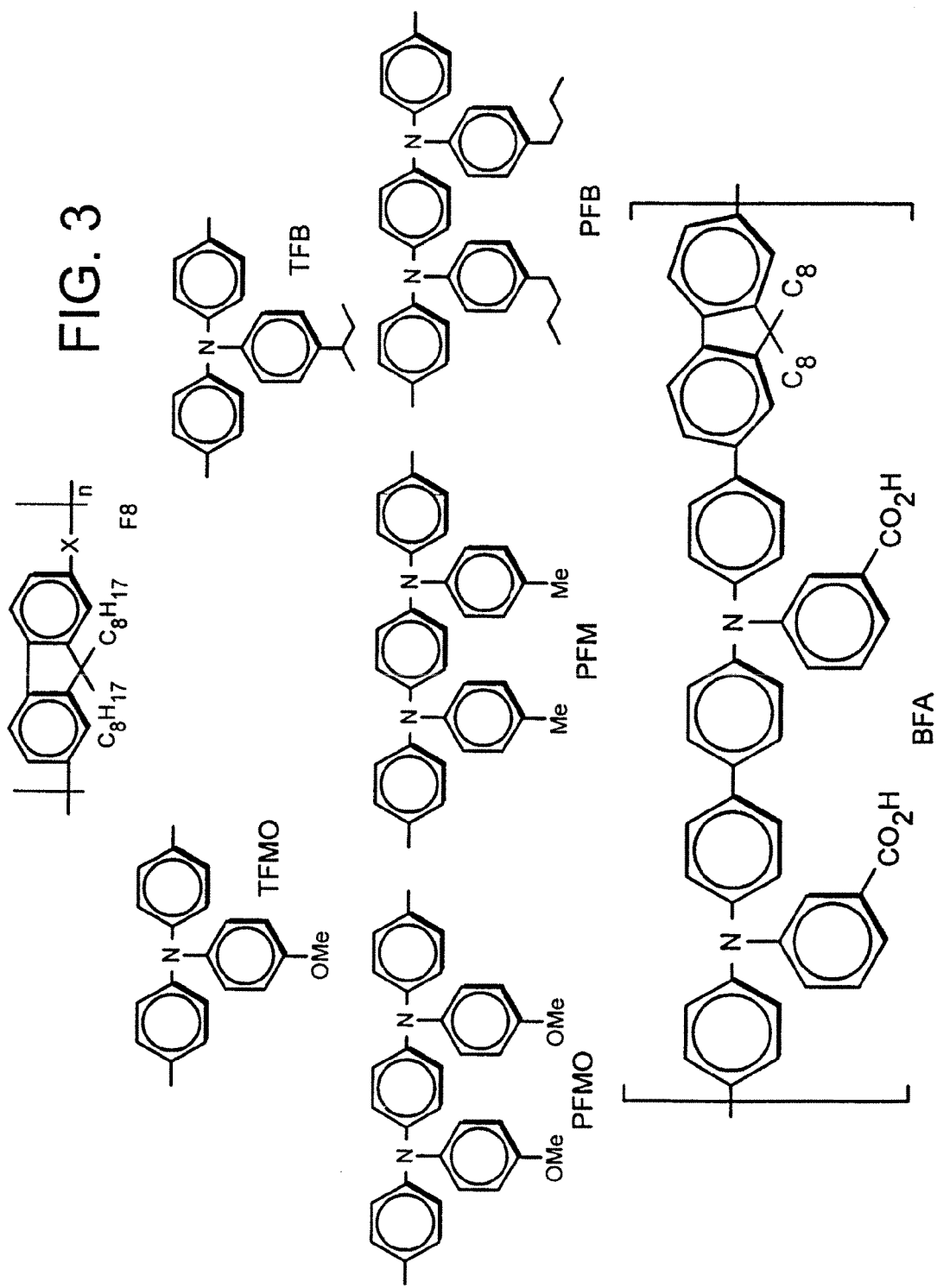
FIG. 3 shows the chemical structures of some materials discussed below.
Figure 9:
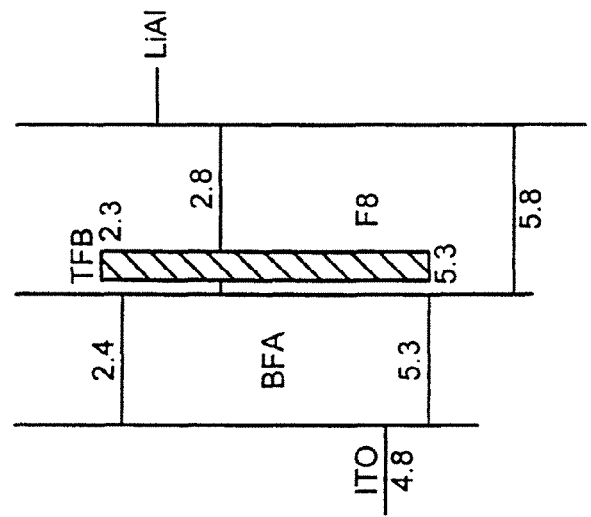
FIG. 9 is a band diagram for a third electroluminescent device.
Figure 10:
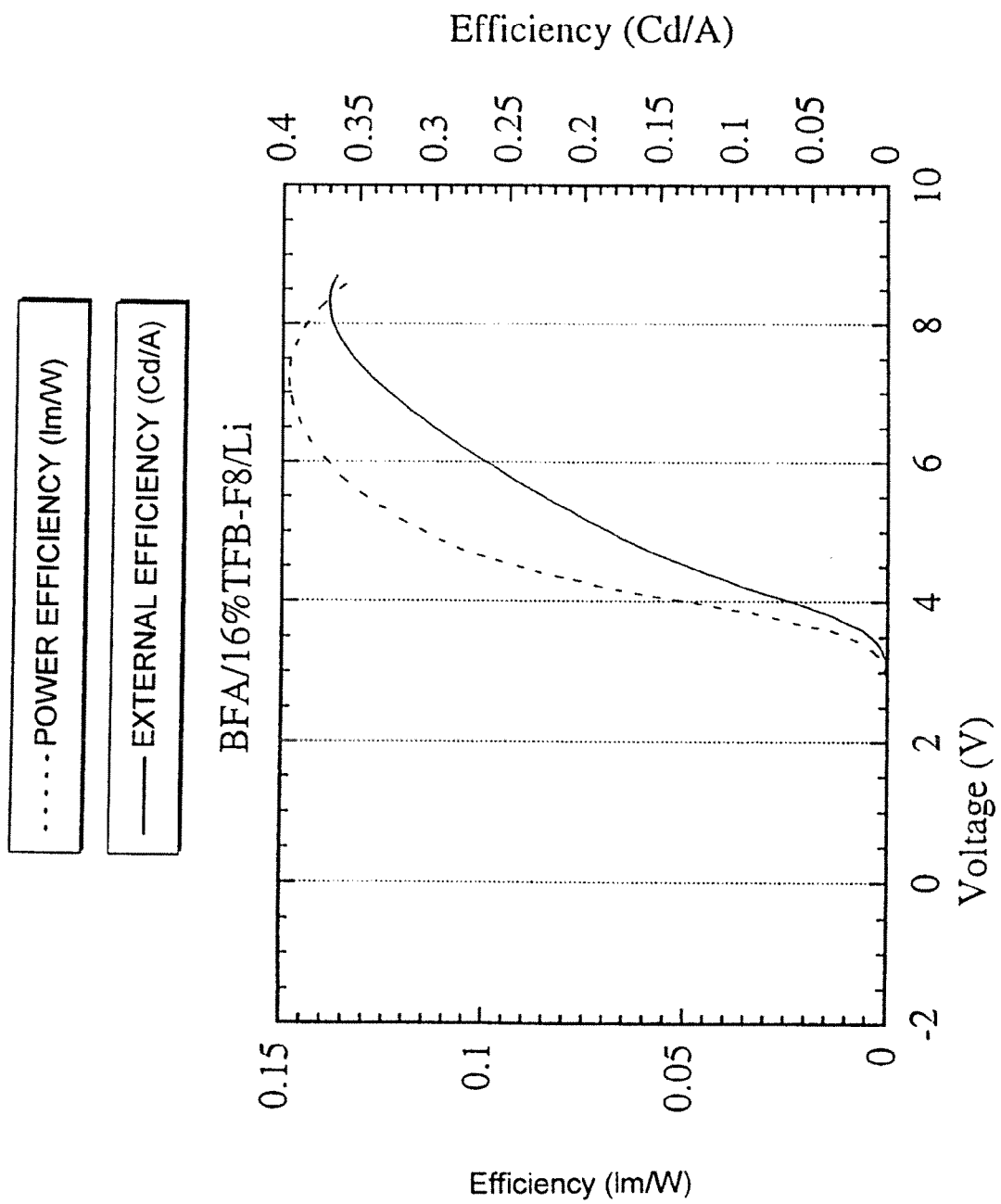
FIG. 10 is a graph plotting the efficiency of the device of FIG. 9 against voltage.
Figure 11:
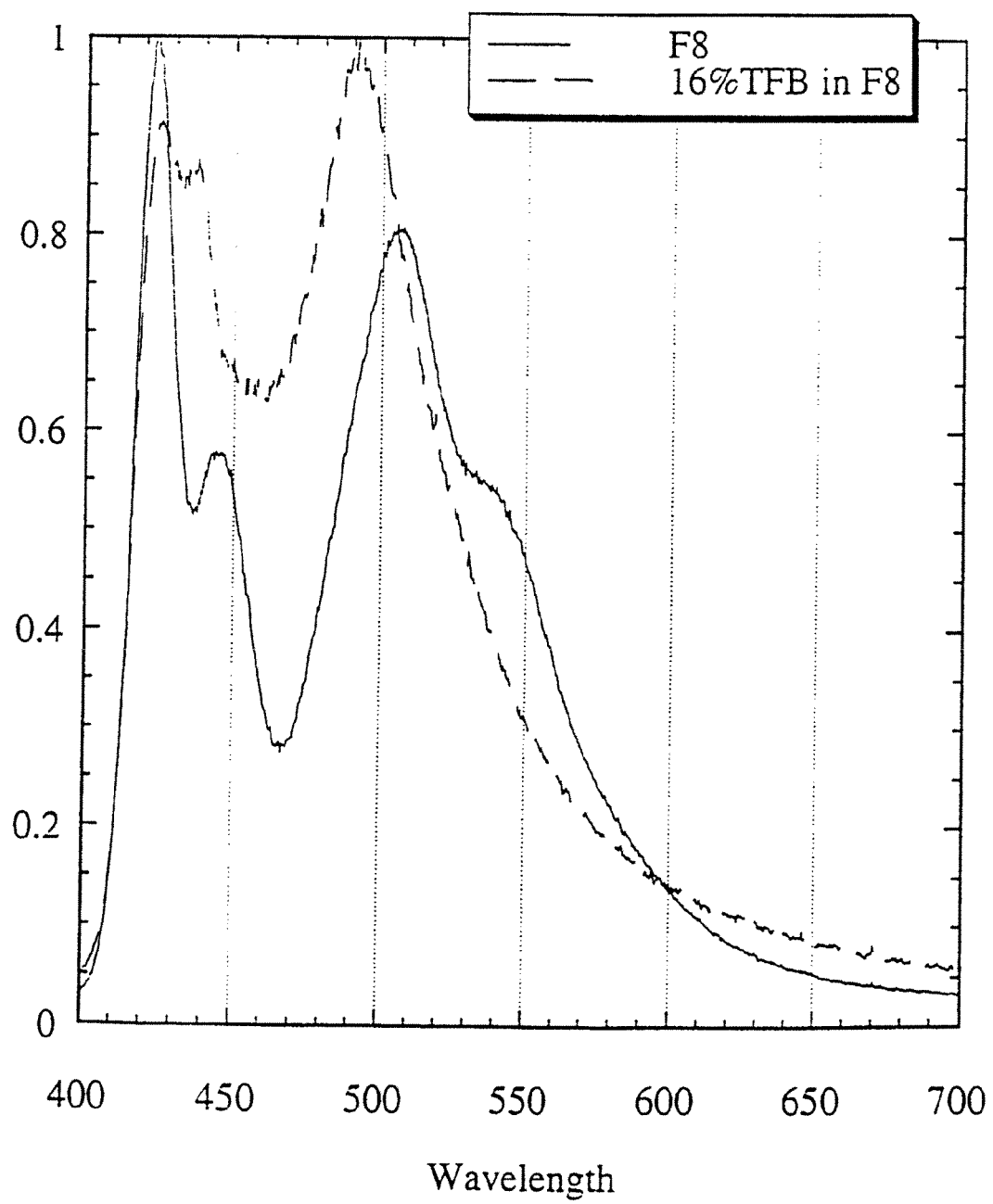
FIG. 11 shows the emission spectrum of the device of FIG. 9.

FIG. 9 is a band diagram for a third device, in which the emissive layer is 84% F8 mixed with 16% TFB. A layer of BFA is again included as an intermediate hole transport layer. There are type II semiconductor interfaces between at least the BFA and the F8, and the TFB and the F8. FIG. 10 shows the power efficiency and the external efficiency of the device against drive voltage. Compared to the device of FIGS. 4 and 5 there is a smaller increase in peak external efficiency (to 0.38 Cd/A) and hence a lower peak power efficiency (around 0.15 lm/W). It is believed that the reduction in drive voltage is due to the HOMO level of the TFB being roughly coincident with the corresponding energy level of the hole transport material (BFA)—this facilitates hole injection into the matrix of the light-emissive layer. FIG. 11 shows the emission spectrum from the device, which indicates that emission from the device, and therefore radiative recombination within the device, is split roughly equally between the TFB and the F8 polymers.

Figure 12:
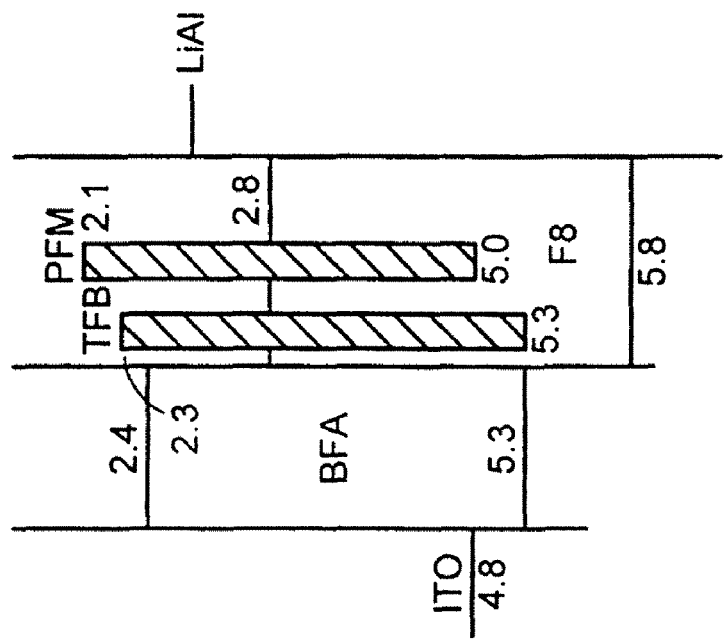
FIG. 12 is a band diagram for a fourth electroluminescent device.
Figure 13:
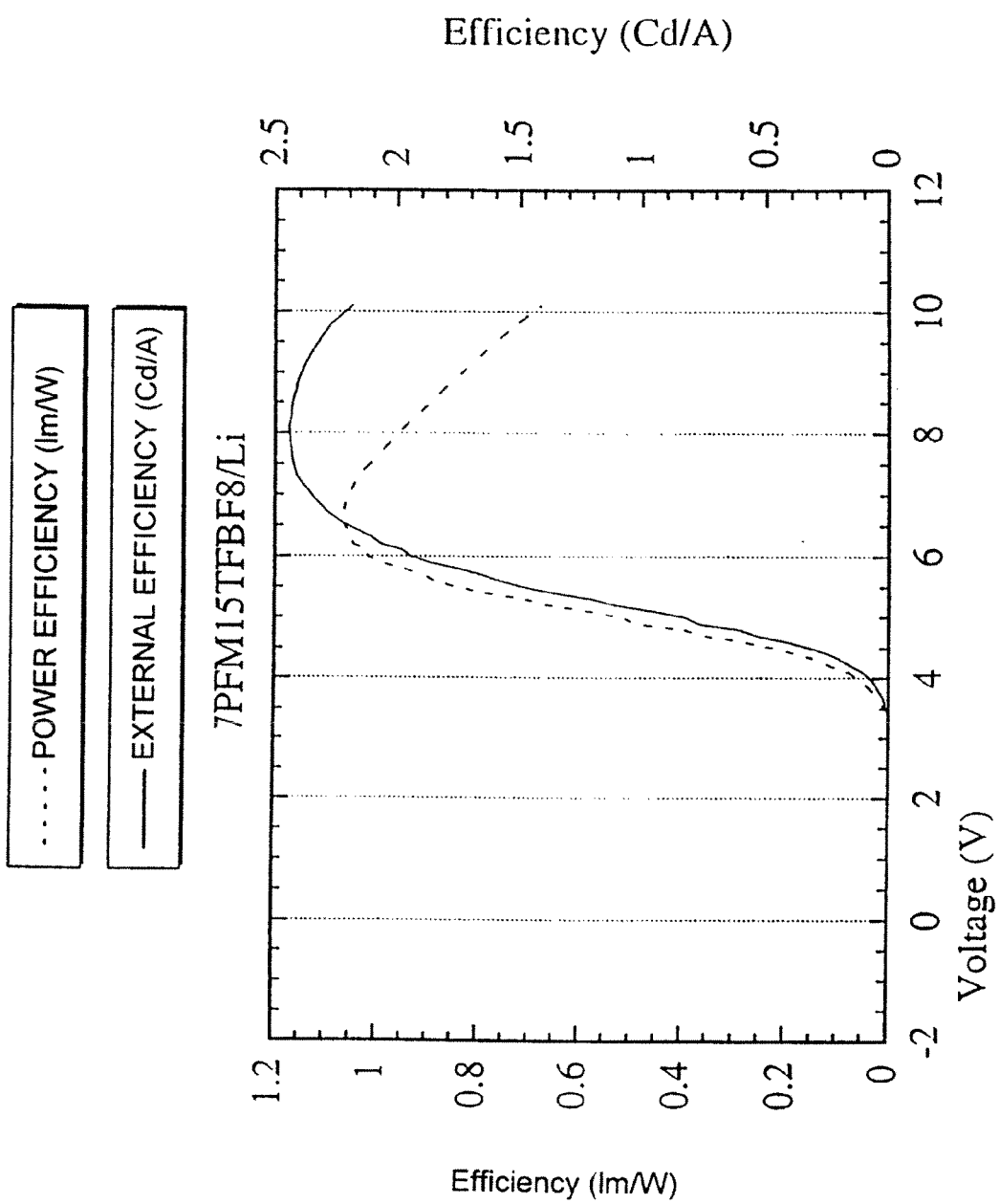
FIG. 13 is a graph plotting the efficiency of the device of FIG. 12 against voltage.
Figure 14:
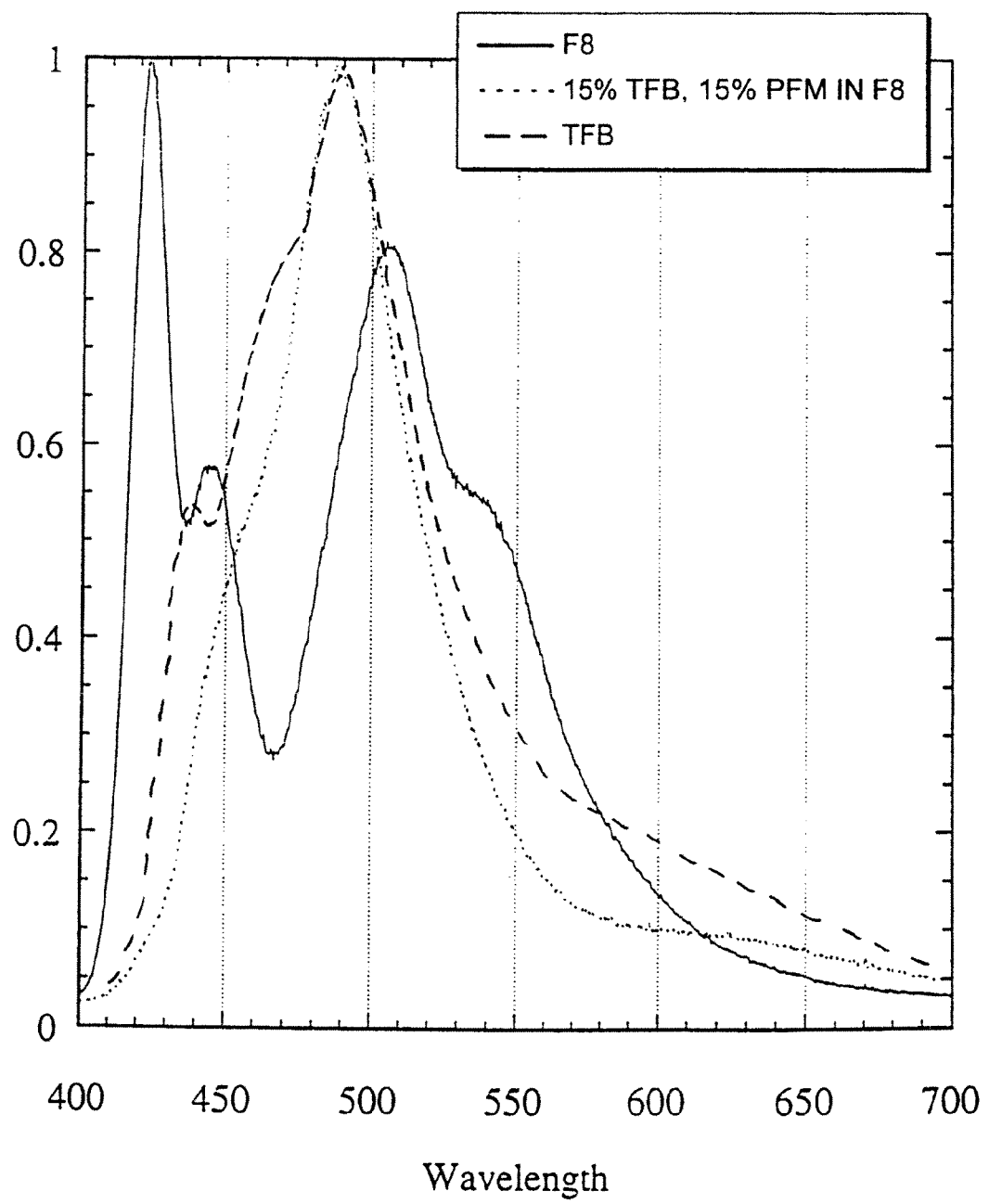
FIG. 14 shows the emission spectrum of the device of FIG. 12.

FIG. 12 is a band diagram for a fourth device, in which the emissive layer is 78% F8 mixed with 15% TFB and 7% PFM. A layer of BFA is again included as an intermediate hole transport layer. There are type II semiconductor interfaces between at least the BFA and the F8, the BFA and the PFM, the TFB and the PFM, the TFB and the F8, and the PFM and the F8. FIG. 13 shows the power efficiency and the external efficiency of the device against drive voltage. This device shows remarkable improvements in performance. The peak external efficiency is around 2.4 Cd/A and the peak power efficiency is around 1.05 lm/W. Peak power efficiency occurs at only around 6.5 V. FIG. 14 shows the emission spectrum from the device, which indicates that all of the emission is from the PFM. The following table compares these results with those for the devices of FIGS. 4 to 11.

TABLE 2

| Composition of emissive layer | Peak power efficiency (lm/W) | Voltage at peak power efficiency (V) | Peak external efficiency (Cd/A) | Emitting material |
|---|---|---|---|---|
| F8 | 0.03 | 8.7 | 0.074 | F8 |
| PFM:F8 | 0.33 | 9.0 | 1 | PFM + F8 |
| TFB:F8 | 0.15 | 7.0 | 0.37 | TFB + F8 |
| TFB:PFM:F8 | 1.05 | 6.5 | 2.4 | PFM |

The high efficiency of the device of FIGS. 12 to 14 is especially surprising since its emission is from PFM which, as table 1 shows, has by far the lowest PL efficiency of any of the materials used.

It is believed that in the device of FIGS. 12 to 14 the TFB acts to accept holes from the hole transport layer into the polymer matrix of the emissive layer, the holes then being localised on PFM segments. Thus the TFB acts to promote injection of holes into the emissive layer. The LUMO level of the TFB is roughly halfway between those of the F8 and the PFM, so it is believed that the TFB LUMO level also provides an intermediate energy step which enhances the rate of transfer of electrons to the PFM when the device is under bias. Also, PFM has a slightly lower optical gap than F8 or TFB, making it energetically favourable for the excitons to form on the PFM regions.

The device of FIGS. 12 to 14 could be adapted by substituting PFMO for the PFM. PFMO has a PL efficiency of 40% (see table 1) and the resulting device has a power efficiency of up to 1.5 lm/W, with emission being from the PFMO. Since PFMO has the same optical gap as F8 and TFB (see table 1) this result suggests that Förster transfer is not the dominant mechanism by which the exciton is confined to the PFMO polymer, although it can be envisaged that it could enhance efficiency. Instead, it is believed that under bias the energy line-up between the hole transport layer and the TFB promotes hole injection into the matrix of the emissive layer. This is followed by transfer to the lower energy HOMO level of the PFMO. However, when TFB is present there is also an energy step in the LUMO levels roughly halfway between those of the PFMO and the F8. Thus, when the device is biased the TFB promotes electron transfer on to PFMO polymer segments. In practice there is likely to be a distortion of the energy levels near the polymer interfaces, unlike the simple representation in FIG. 12.

This explanation is supported by the results of changing the cathode from LiAl to CaAl. CaAl has a higher workfunction than LiAl. If electron transport through the matrix of the emissive layer were via F8, followed by excitation to the PFM or the PFMO then the use of a higher workfunction material should not affect the efficiency, because the workfunction is still close to the LUMO level of F8. However, if electrons were injected from the LiAl cathode and transferred to the PFM predominantly via the TFB then power efficiency would be expected to fall, because of the higher drive voltage that would be required to overcome the barrier to electron injection between CaAl and TFB. The applicant has observed no significant difference in performance between devices with LiAl or CaAl cathodes.

Figure 18:
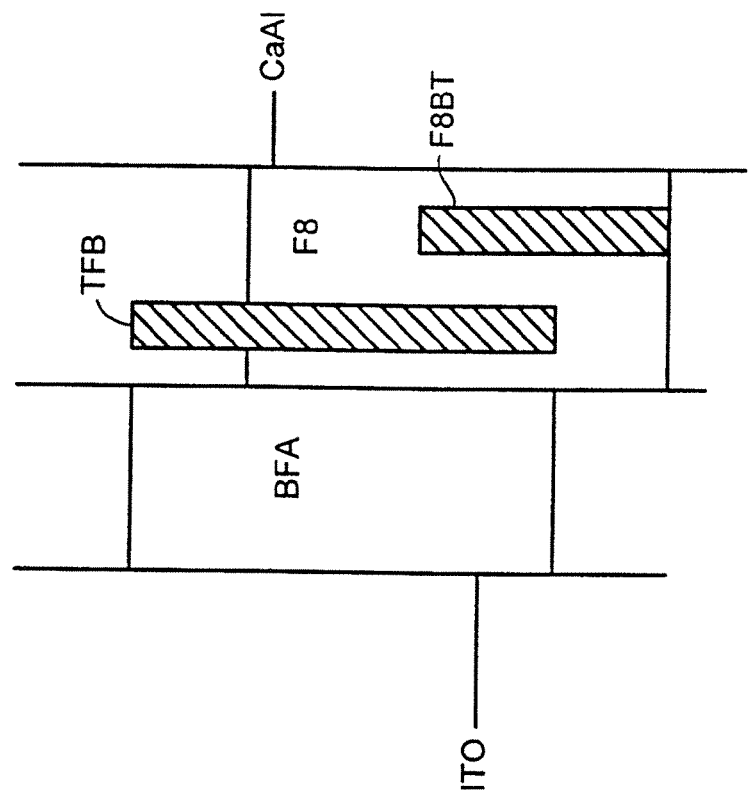
FIG. 18 is a band diagram for the device of FIG. 17.
Figure 15:
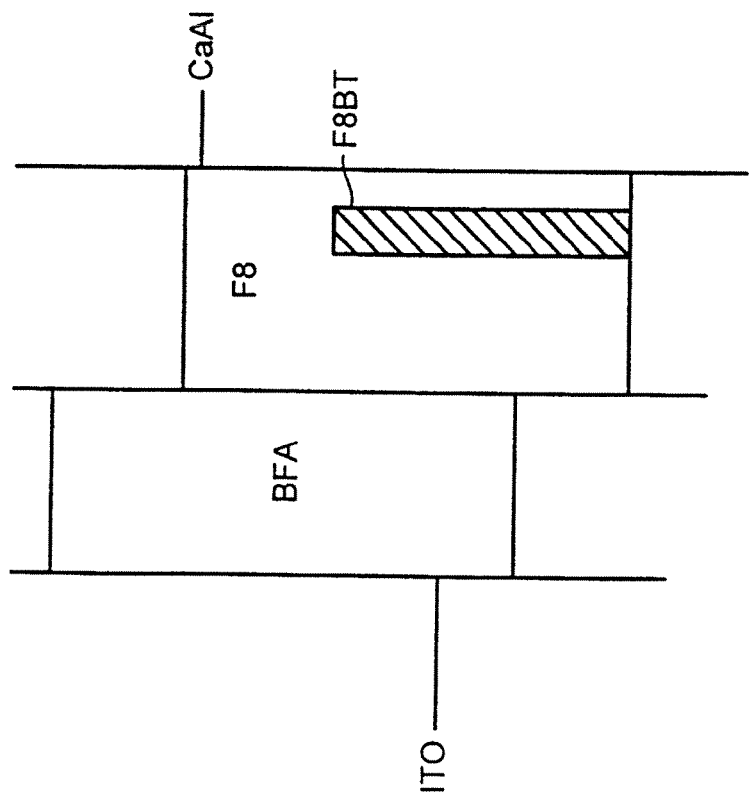
FIG. 15 is a band diagram for a fifth electroluminescent device.
Figure 16:
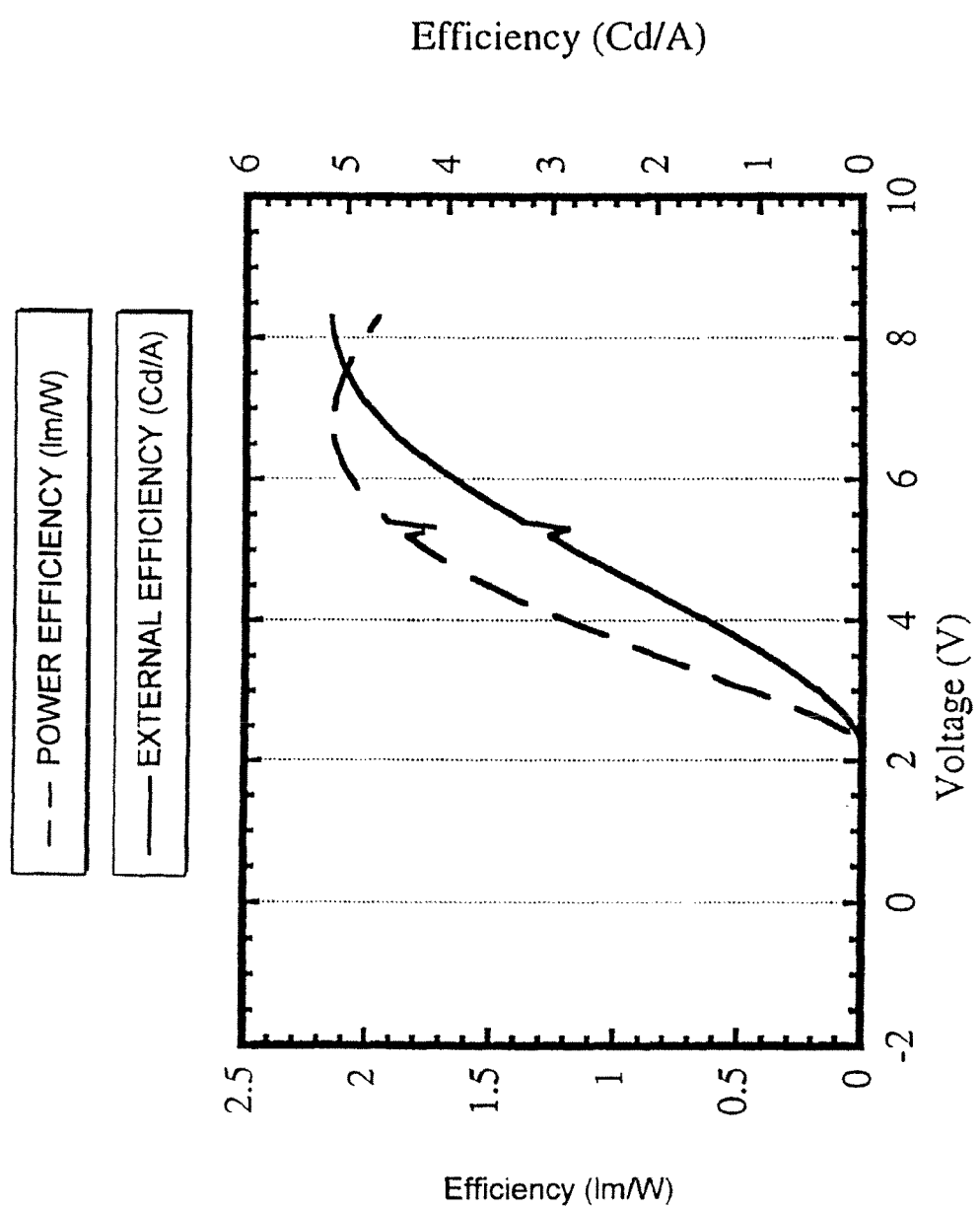
FIG. 16 is a graph plotting the efficiency of the device of FIG. 15 against voltage.
Figure 17:
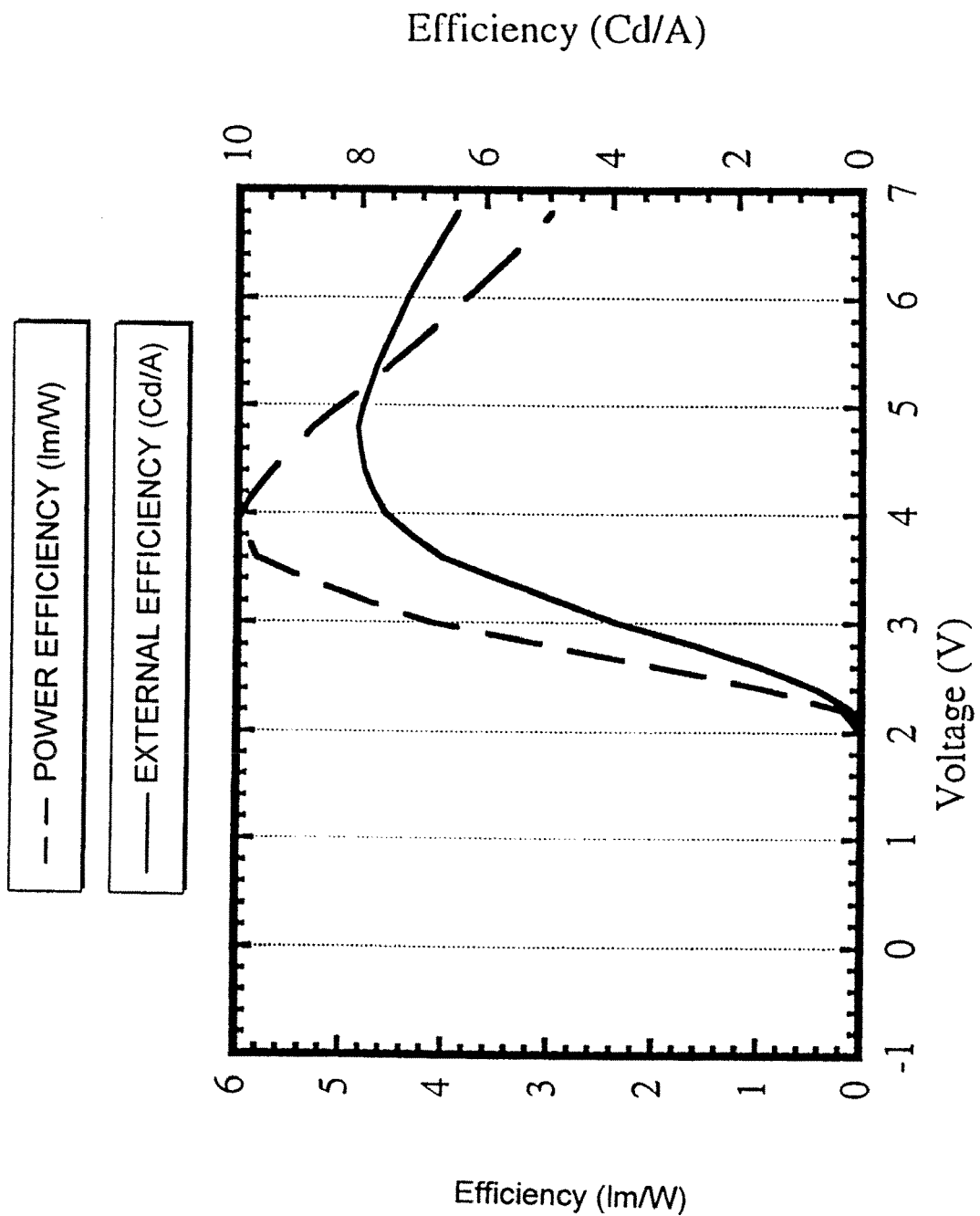
FIG. 17 is a graph plotting the efficiency of a sixth electroluminescent device against voltage.
Figure 19:
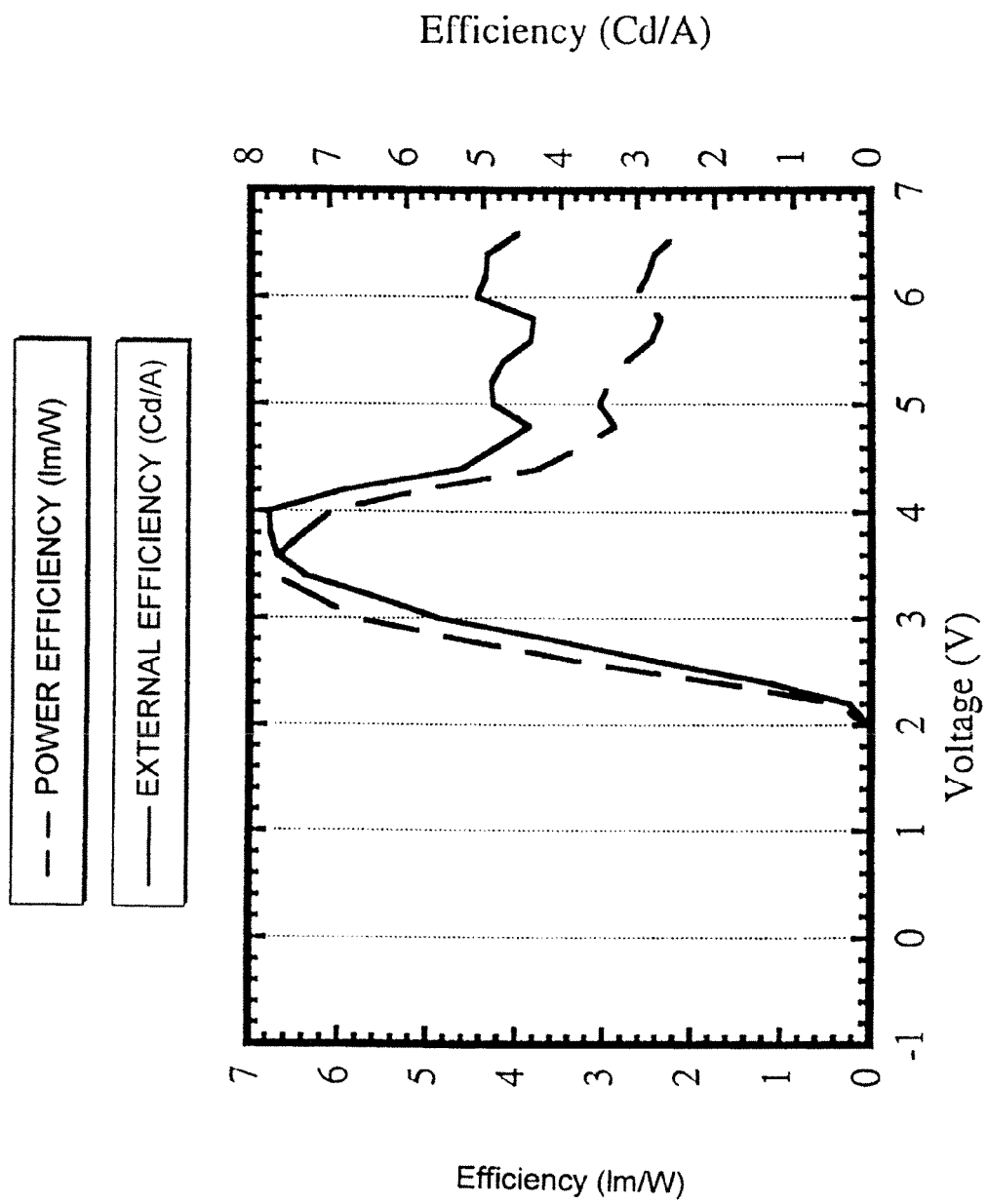
FIG. 19 is a graph plotting the efficiency of a seventh electroluminescent device against voltage.

FIG. 15 is a band diagram for a green emitting device in which the emissive layer is another two-component polymer mixture. In this device the emissive layer is 95% F8 mixed with 5% F8BT. The F8BT dopant forms a type I semiconductor interface with the host F8, but both form type II semiconductor interfaces with the BFA. FIG. 16 shows the power efficiency and the external efficiency of the device against drive voltage. The power efficiency is around 2.0 to 2.5 lm/W. FIG. 17 shows the power efficiency and the external efficiency against drive voltage for a device similar to that of FIGS. 15 and 16 but in which the emissive layer is a three-component mixture: of first F8 mixed with F8BT in the ratio 19:1, and then that mixture mixed with TFB in the ratio 4:1 (i.e. (F8:F8BT [0.95:0.05]):TFB [0.75:0.25]). FIG. 18 is a band diagram for such a device. FIG. 19 shows the power efficiency and the external efficiency against drive voltage for a device similar to that of FIGS. 15 and 16 but in which the emissive layer is mixed as (F8:F8BT [0.95:0.05]):TFB[0.5: 0.5]. The results for these three devices are summarised in the following table.

TABLE 3

| Amount of TFB in emissive layer (%) | Peak power efficiency (lm/W) | Voltage at peak power efficiency (V) | Peak external efficiency (Cd/A) | Voltage at peak external efficiency (V) |
|---|---|---|---|---|
| 0 | 2.4 | 6.8 | 5.2 | Approx. 8.5 |
| 25 | 6 | 3.8 | 8 | 4.5 |
| 50 | 6.7 | 3.5 | 7.8 | 3.8 |

As the amount of TFB reaches between 50 and 60% the peak efficiency decreases. There is also an increase in external efficiency when TFB is added, principally over the range from 0 to 20% TFB. This is valuable for practical applications.

Efficiencies of greater than 20 lm/W may be achieved using these 5F8BT:TFB 80:20 structures with PEDOT:PSS as the hole-transport layer. (See FIG. 22).

It is believed that, as with the three-component blue-emissive mixtures described above, the TFB promotes hole injection into the polymer matrix of the emissive layer, allowing exciplexes to form. In the green-emissive devices the exciplexes have a relatively high probability of forming excitons on the F8BT polymer because of the higher internal field and because by doing so they can reduce energy by Förster transfer (F8BT having the narrowest optical gap in the matrix). This leads to an improvement in the external efficiency and the power efficiency.

The efficiency of this device may be further improved by including in the emissive layer one or more other polymers whose HOMO levels are between those of the TFB and the F8 (e.g. around 5.5 eV). This should promote excitation of holes from the TFB to the emissive material, and at higher bias fields promote hole injection into the matrix of the emissive layer itself.

It should be noted that including PFM in the green-emissive blend substantially reduces device efficiency. This is believed to be due to its relatively shallow HOMO level, which acts as a deep hole trap, rather than as an intermediary, and thus inhibits formation of excitons on the F8BT polymer.

FIGS. 20 to 27 illustrate some other embodiments of the principles discussed above.

Figure 20:
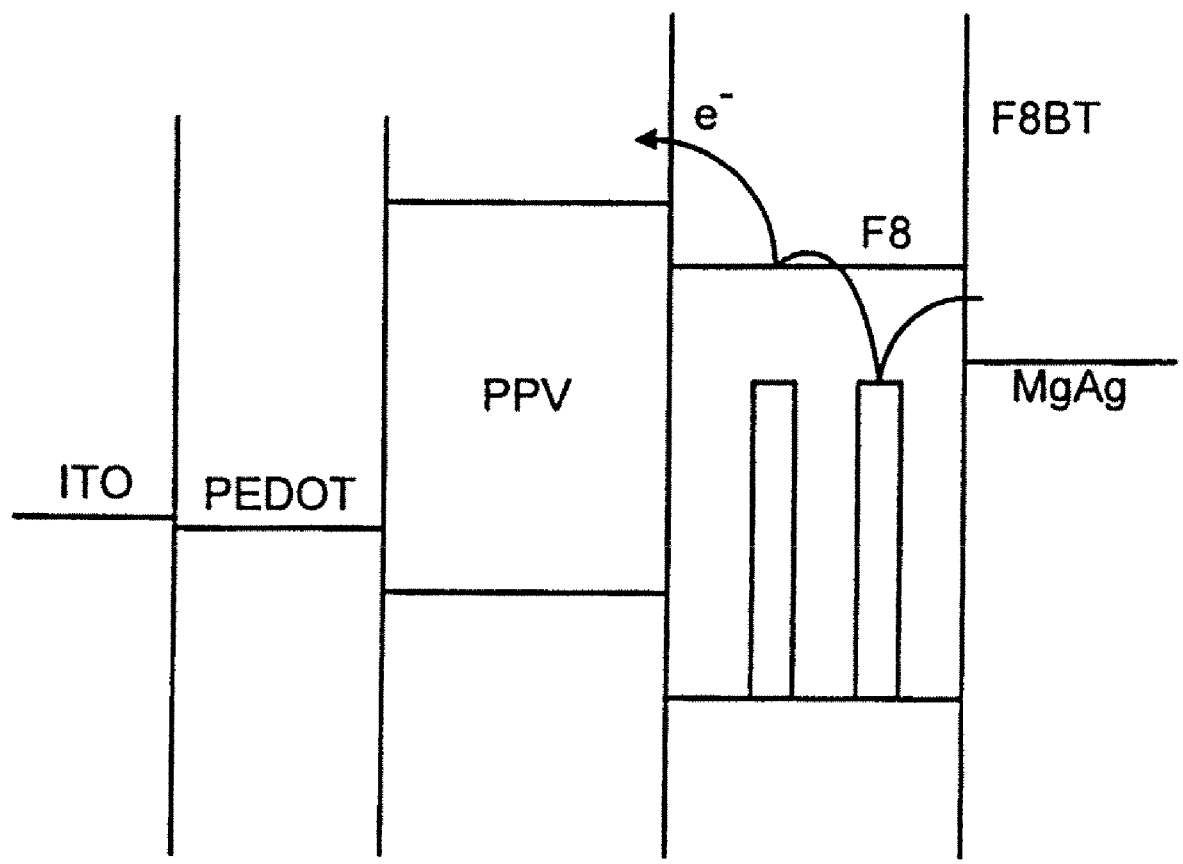
FIG. 20 is a band diagram for an eighth electroluminescent device.

In FIG. 20 the emissive layer is a mixture of F8BT, F8 and PPV. The F8BT:F8 blend is coated over the PPV and acts as an electron transport layer allowing electron transport between the cathode and the conduction band in the PPV. The addition of the F8BT and F8 to the PPV allows the use of a cathode that is more stable than the usual AlLi cathodes, even though it has a higher workfunction. In FIG. 18 the cathode is Mg, whose workfunction is 3.5 eV. An alternative is Al, whose workfunction is 4.2 eV. A further improvement could be made by including in the blend a third polymer with a LUMO level between those of F8BT (3.4 eV) and F8 (2.8 eV).

Figure 21:
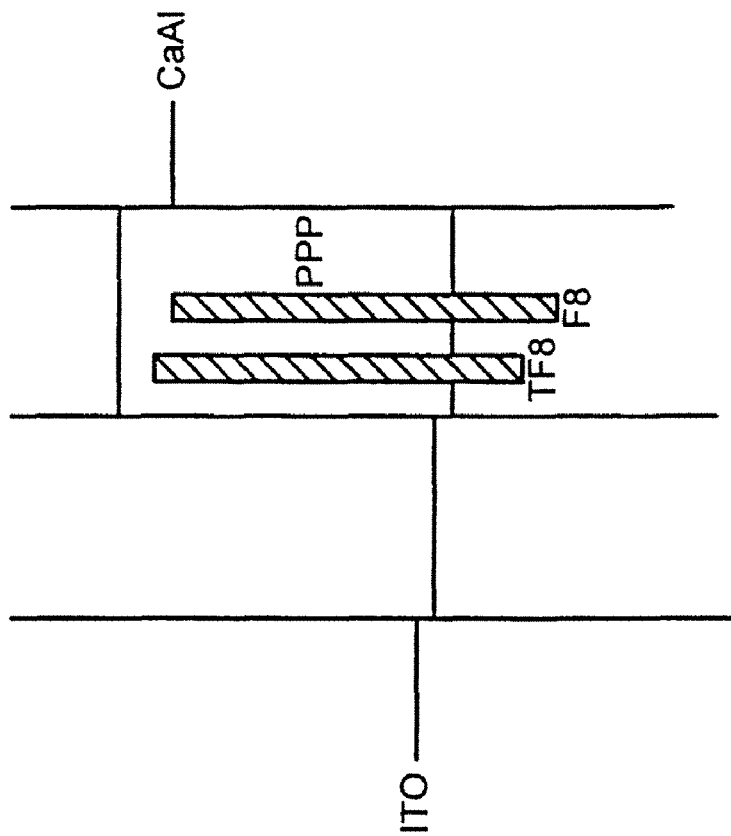
FIG. 21 is a band diagram for a ninth electroluminescent device.

In FIG. 21 the emissive layer is a mixture of poly(paraphenylene) ("PPP"), TFB and F8 with a CaAl cathode. The principles described above in relation to improving hole injection are applied in this device to improve electron injection.

Figure 22:
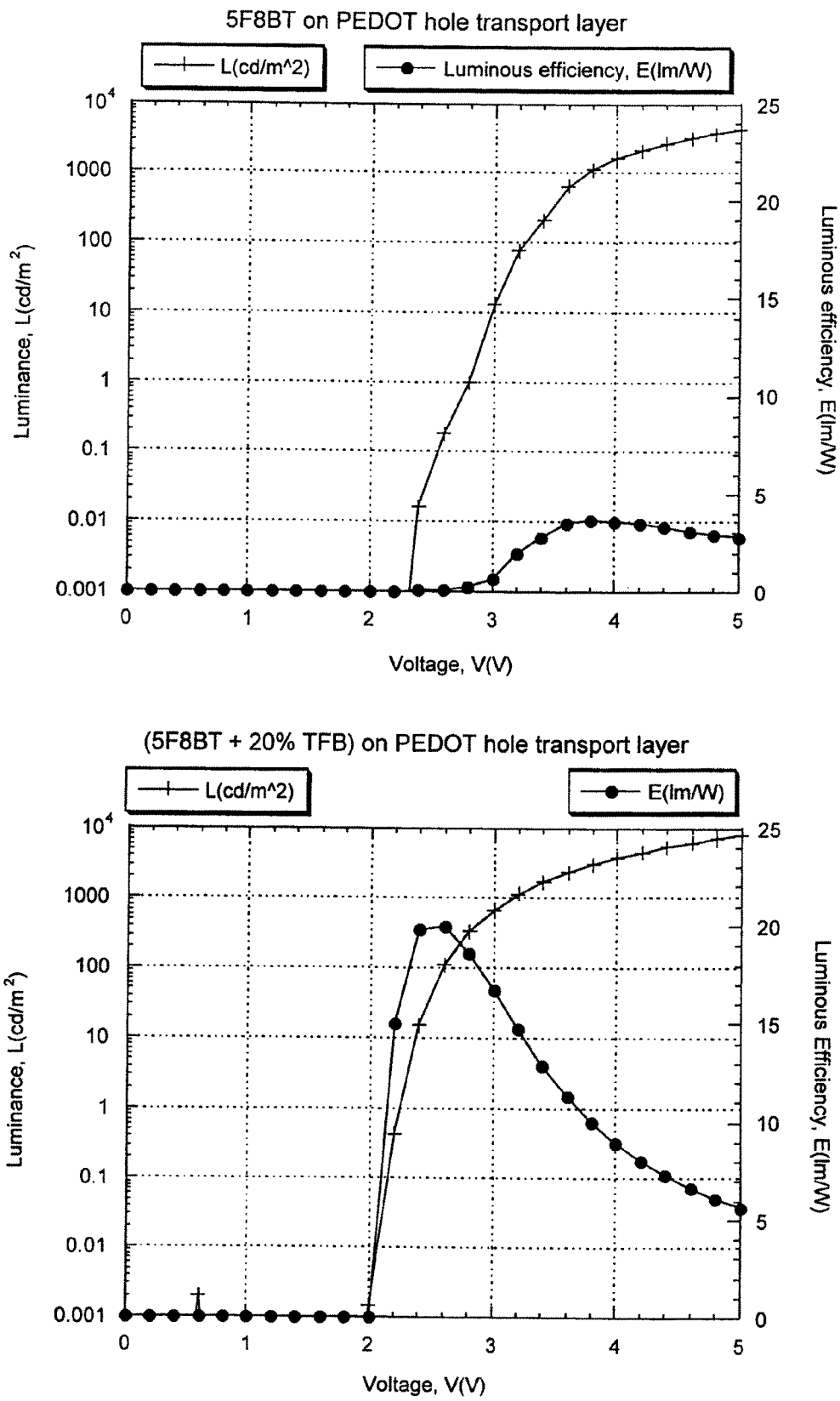
FIG. 22 plots the characteristics of two further electroluminescent devices.

FIG. 22 illustrates the effect of the addition of TFB to a fluorene-based emitter system. The upper panel of FIG. 22 shows the luminance and luminous intensity at a range of voltages for a device in which the emissive layer is 5F8BT. The lower panel of FIG. 22 shows equivalent data for a device in which the emissive layer is 5F8BT with 20% TFB. Both devices have a PEDOT:PSS hole transport layer. The results show that the addition of TFB to the emissive layer improves peak efficiency from around 3.5 lm/W to around 20 lm/W. It has been found that PEDOT:PSS is superior to BFA as a hole transport layer in such devices, especially when "electronic grade" PEDOT:PSS is used.

Figure 23:
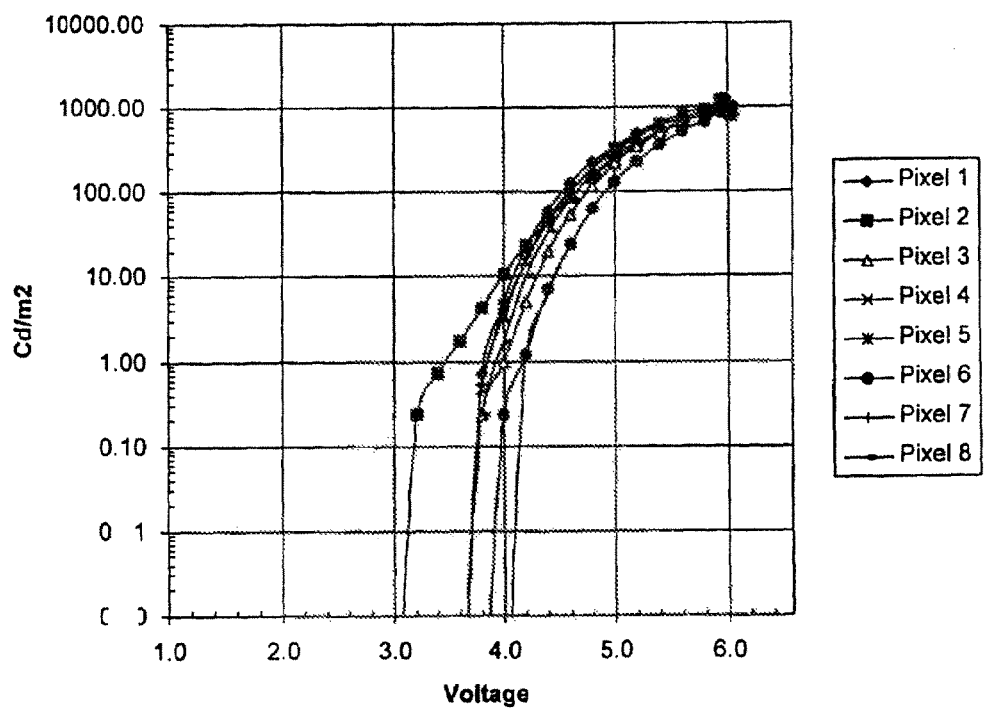
FIG. 23 plots the characteristics of an 8 pixel electroluminescent device.
Figure 23:
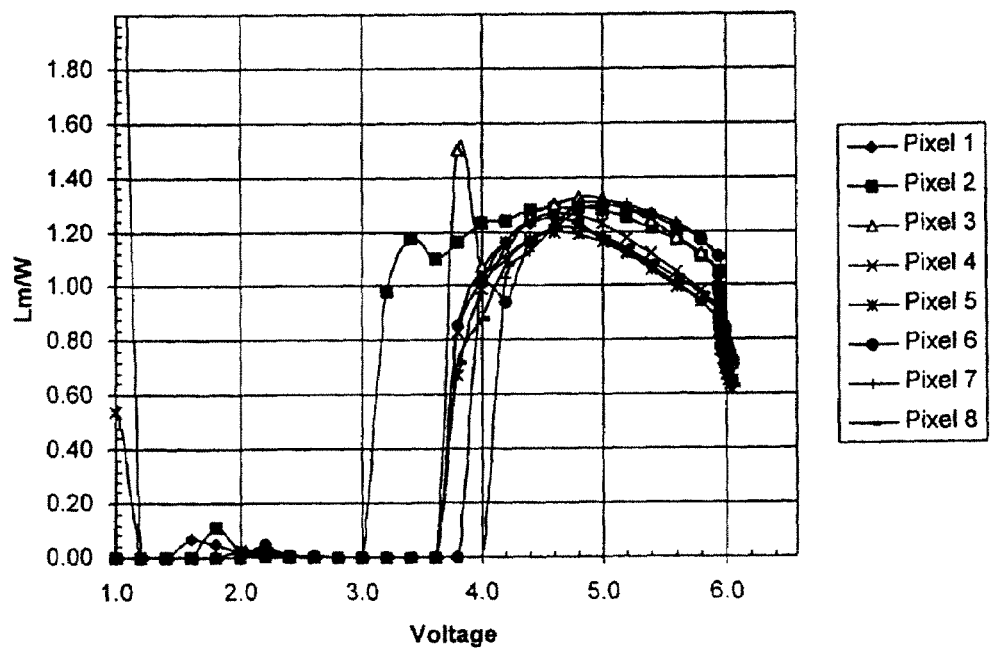
Figure 23:
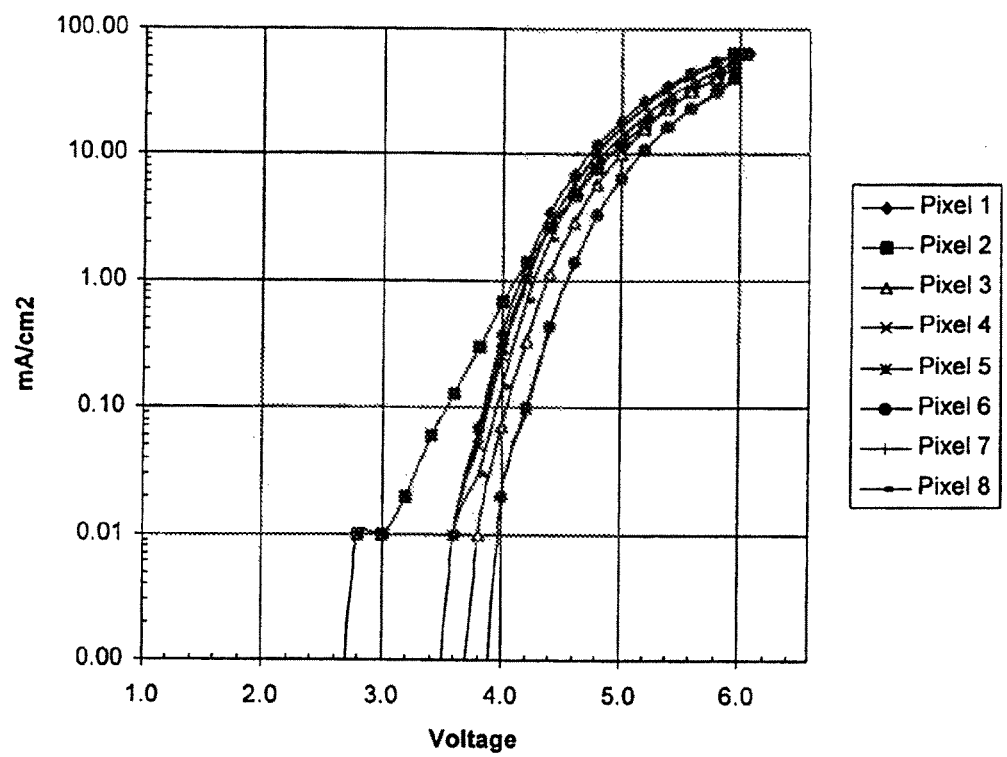
Figure 23:
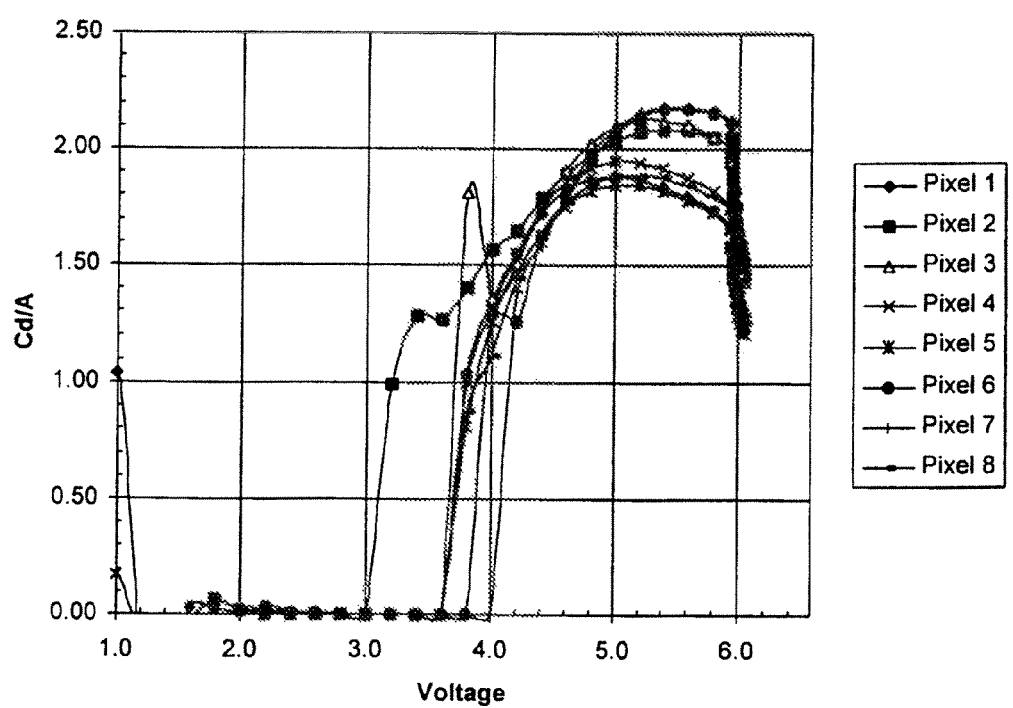
Figure 24:
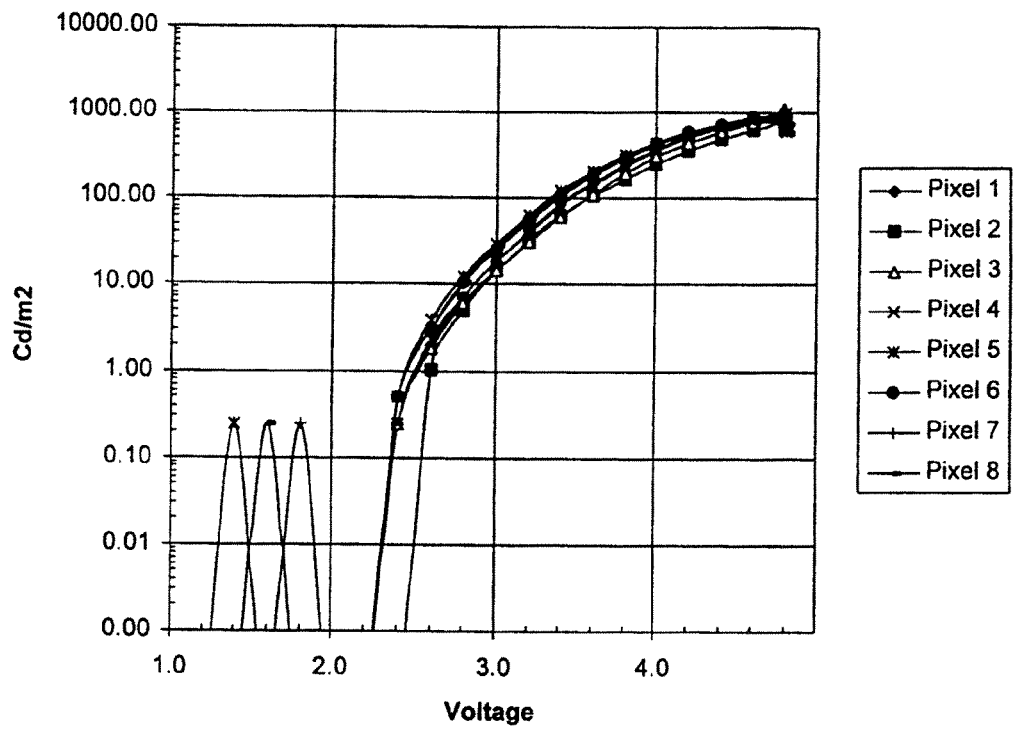
FIG. 24 plots the characteristics of another 8 pixel electroluminescent device.
Figure 24:
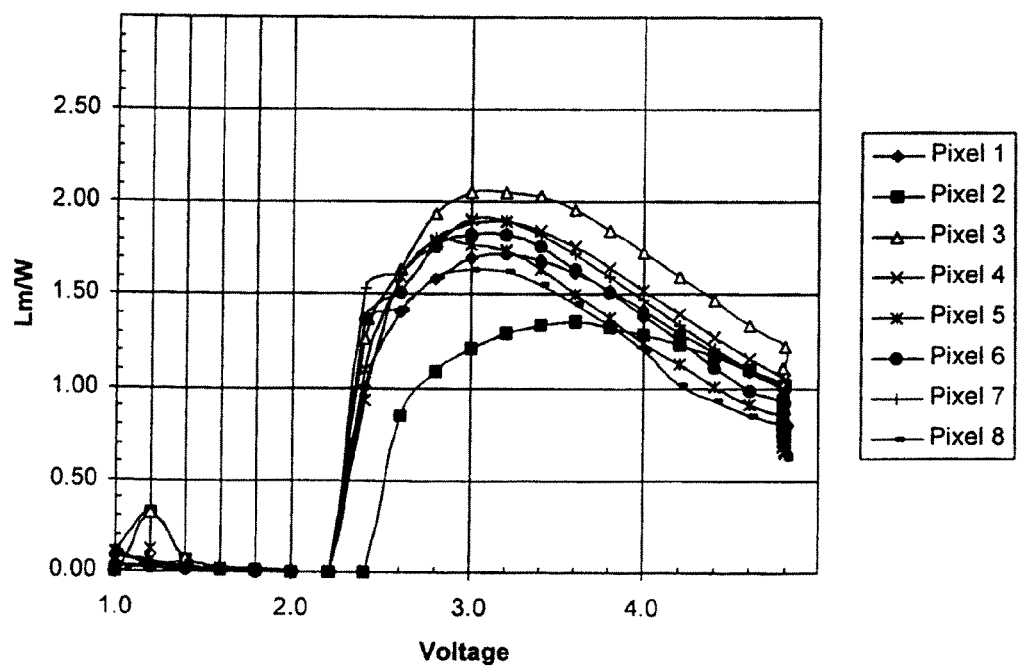
Figure 24:
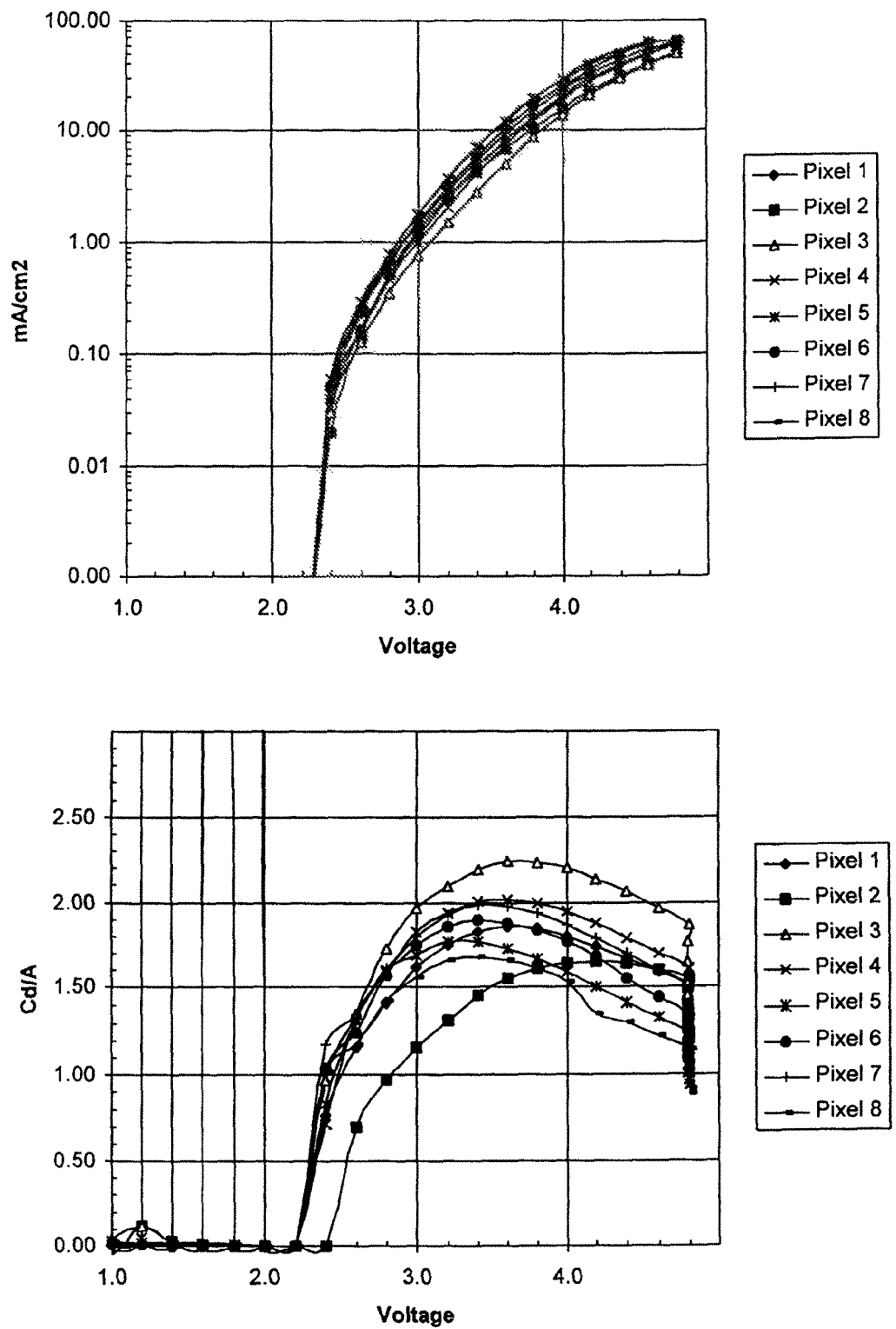
Figure 25:
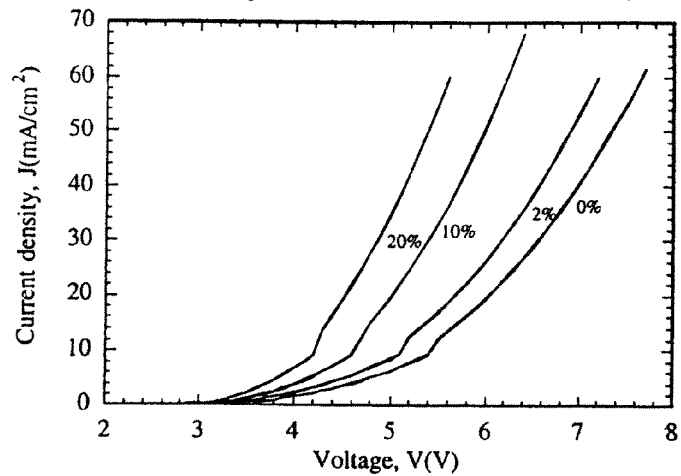
FIG. 25 plots the characteristics of a set of devices having from 0% to 20% TFB.
Figure 25:
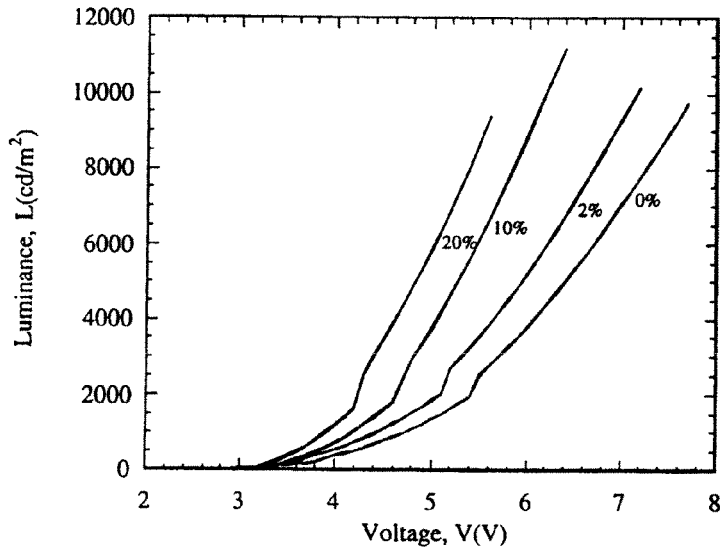
Figure 25:
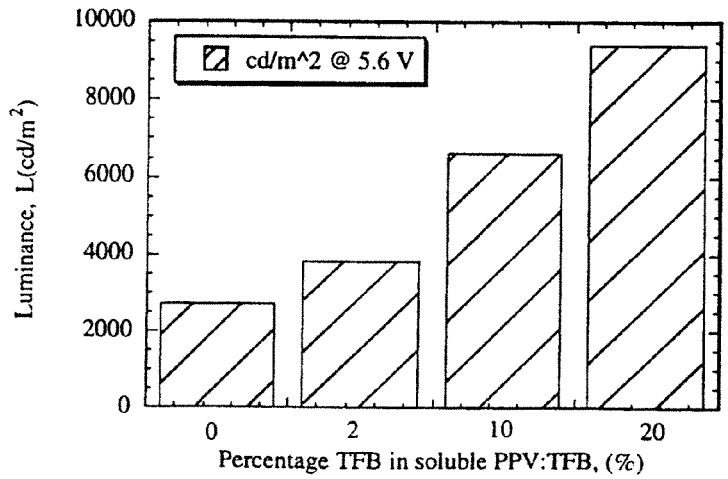

FIGS. 23 to 25 show data for devices in which the emissive component is not fluorene-based. FIG. 23 shows a set of plots of luminance ($Cd/m^2$), current density ($mA/cm^2$), luminous efficiency (lm/W) and external efficiency (Cd/A) at a range of voltages for an 8 pixel device in which the emissive layer is the soluble PPV emitter Bis-DMOS PPV (bis dimethyl octyl silyl poly phenylene vinylene, with two side units of the formula being $SiMe_2C_8H_{17}$ on the phenyl ring, see FIG. 27). The emissive layer was spun on to hole transport layers of PEDOT:PSS. FIG. 24 shows equivalent data for devices in which the emissive layer is Bis-DMOS PPV with 25% TFB. The addition of the TFB was found to improve turn-on voltage from around 3.5 to around 2.5V and to increase the efficiency to around 2.0 lm/W. FIG. 25 shows plots of the characteristics of a series of devices in which the emissive layer is formed from another soluble PPV (PPV A of table 1) with additions of 0%, 2%, 10% or 20% TFB. The upper panel of FIG. 25 plots the current density of such devices against voltage. The middle panel of FIG. 25 plots the luminance of such devices against voltage. The lower panel of FIG. 25 shows the luminance of such devices at a constant voltage of 5.6V. The luminance and current density was found to increase with increasing TFB content. At 5.6V the addition of 20% TFB was found to increase luminance by around 400% over a device with 0% TFB.

Figure 26:
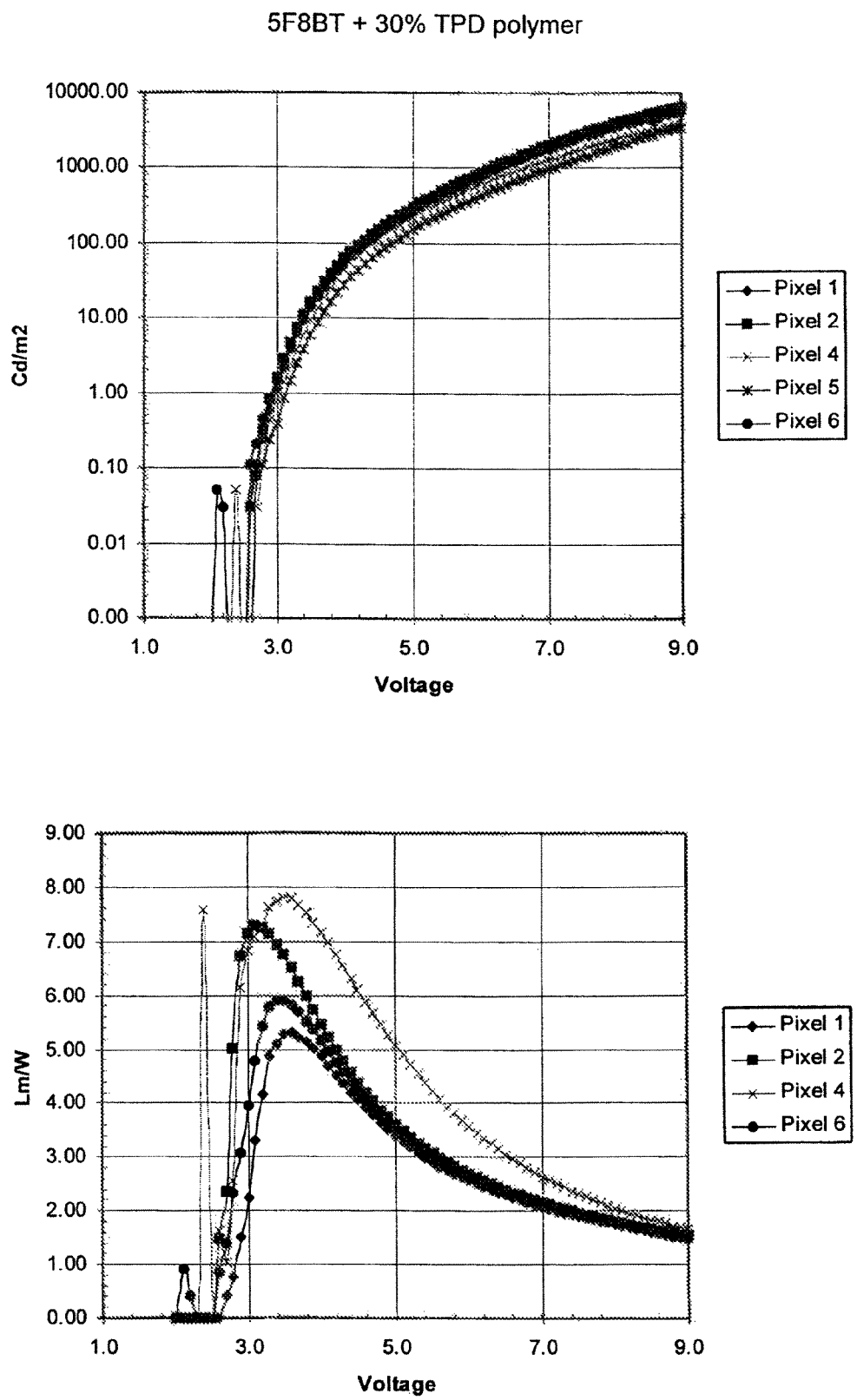
FIG. 26 plots the characteristics of a 4 pixel electroluminescent device whose emissive layers comprise a TPD polymer.
Figure 26:
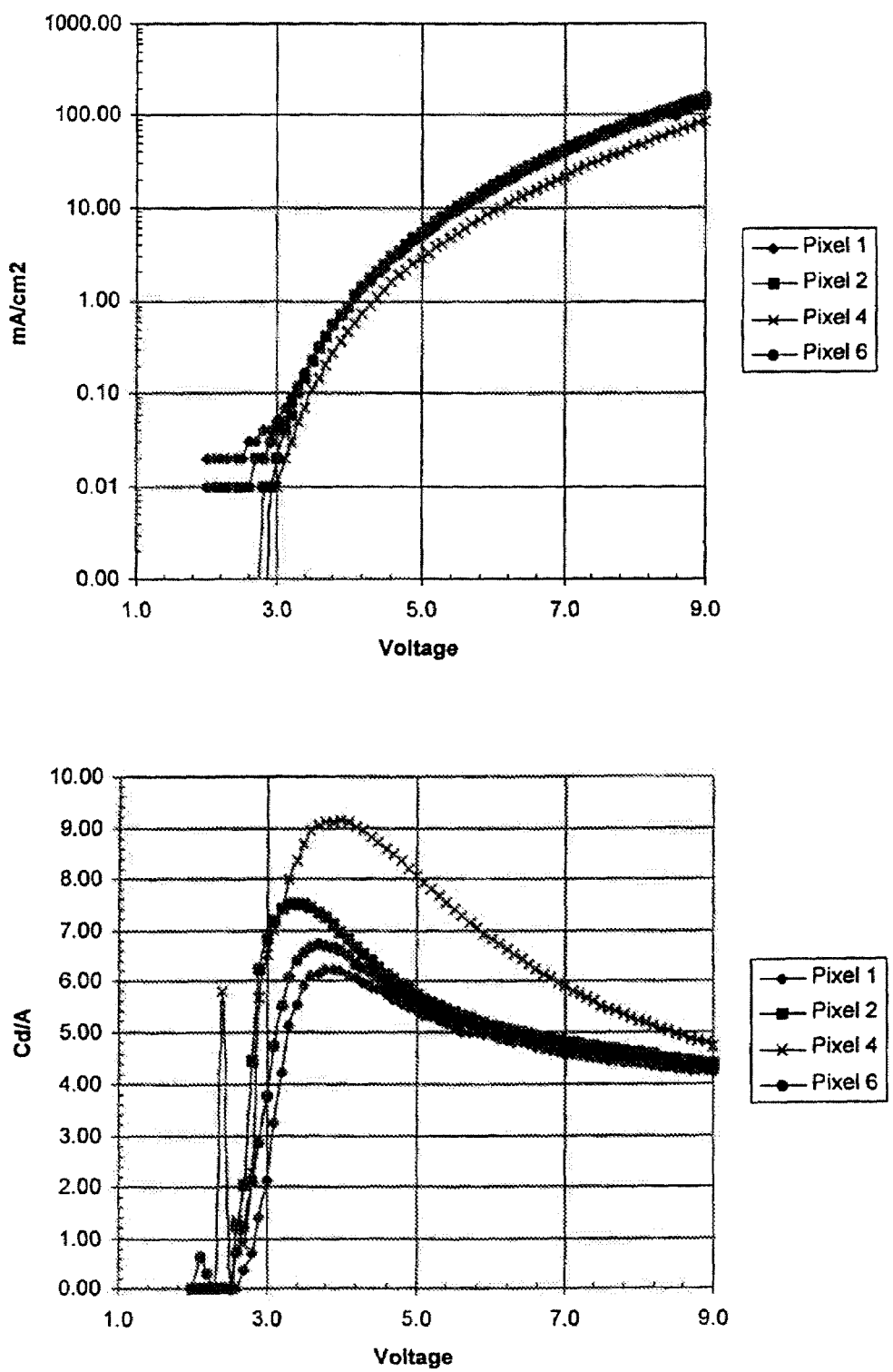
Figure 27:
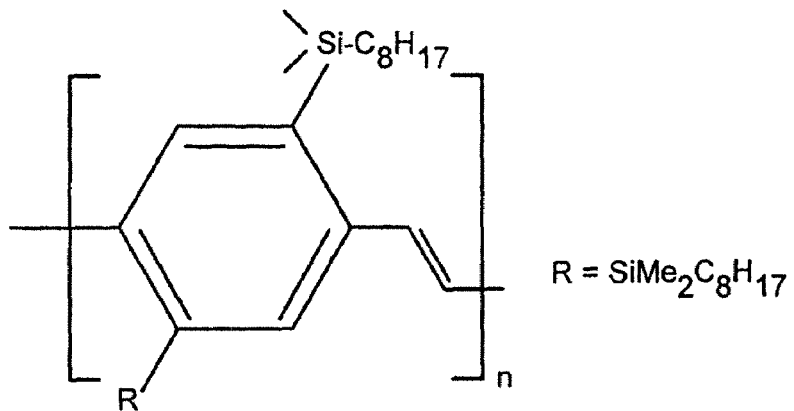
FIG. 27 shows the structure of Bis-DMOS PPV.
Figure 29:
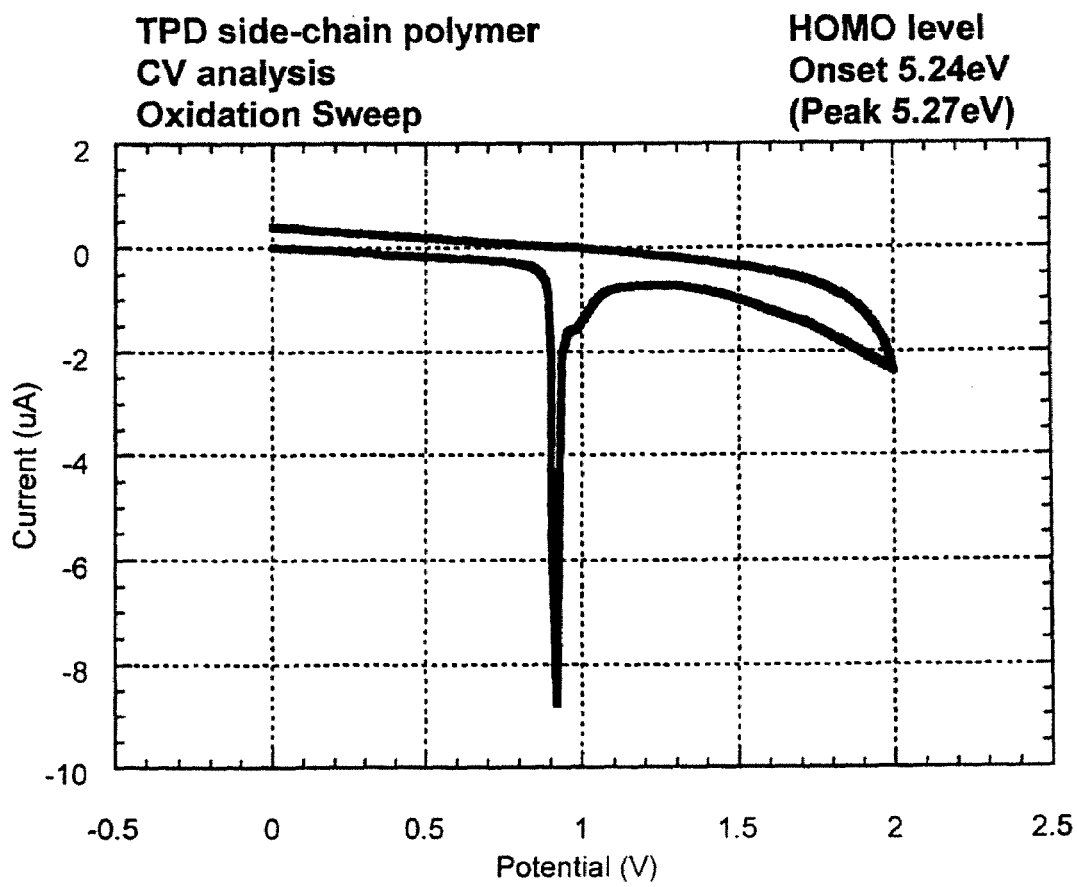
FIG. 29 shows the results of cyclic voltammetry analysis of a TPD side-chain polymer.

FIG. 26 shows a set of plots of luminance ($Cd/m^2$), current density ($mA/cm^2$), luminous efficiency (lm/W) and external efficiency (Cd/A) at a range of voltages for a 4 pixel device in which the emissive layer was formed from a mixture of 70% 5F8BT and 30% of a polyethylene-based polymer with TPD-based side-chains. The maximum efficiency was found to be 8 lm/W whereas similar devices in which the emissive layer was of 5F8BT alone were found to have maximum efficiencies of 2 lm/W. FIG. 29 shows a cyclic voltammetry oxidation sweep of the polyethylene-based polymer with TPD-based side-chains, showing that its HOMO level is in the region of 5.25 eV, i.e. between that of the emissive component and that of the hole-injecting layer.

In some cases it may be expected that a degree of surface phase separation will occur, with one or more of the components of the light-emissive layer increasing in concentration near a surface of the emissive layer due to the interactions of the material(s) of the emissive layer with the adjacent surfaces. Methods that could be used for detecting such separation include an atomic force microscope in tapping mode, and other similar techniques.

Figure 28:
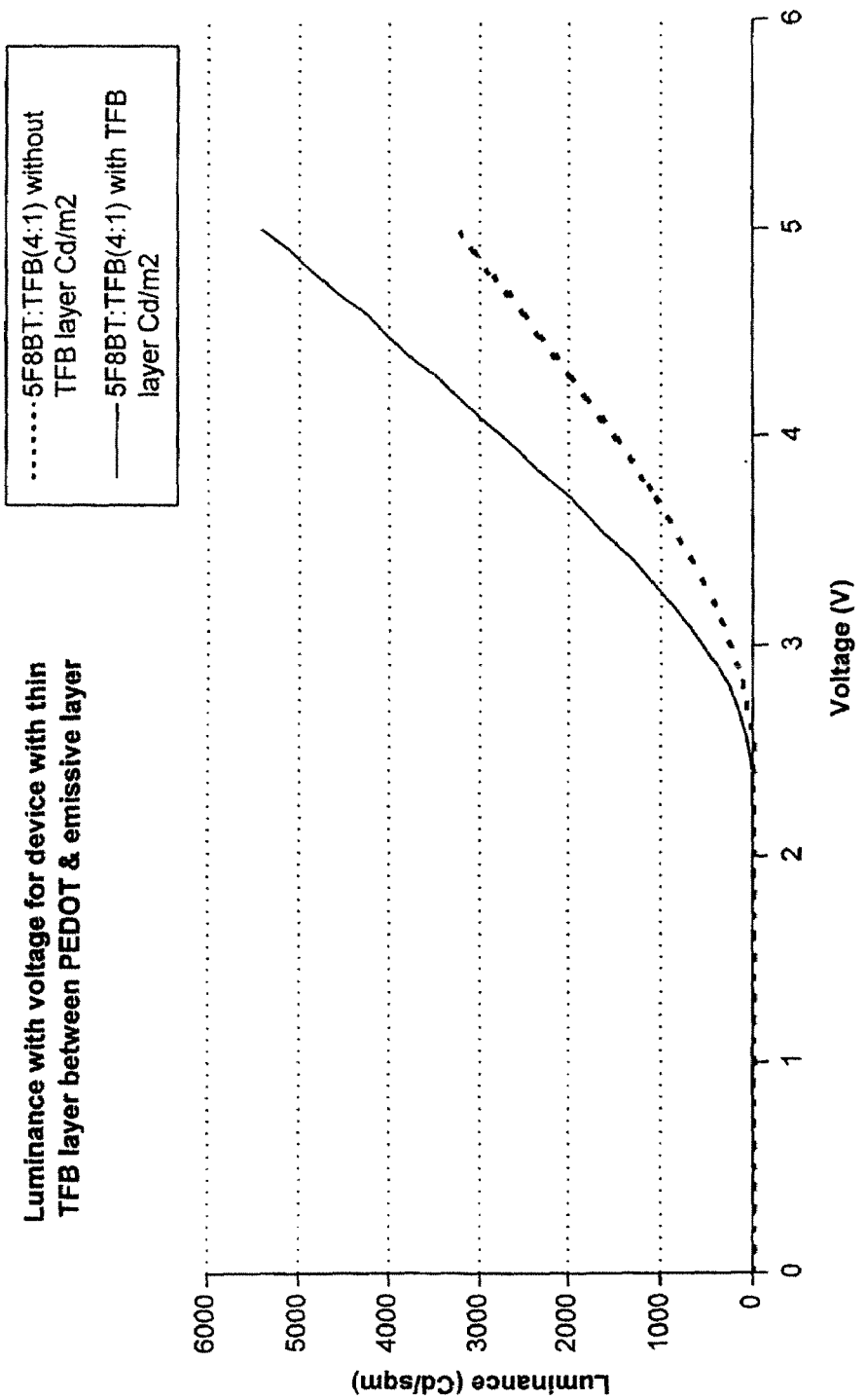
FIG. 28 shows the characteristics of two further devices.

FIG. 28 shows plots of luminance at a range of voltages for a pair of devices in which the emissive layer is formed from a blend of 5F8BT:TFB (4:1) deposited over a hole transport layer of PEDOT:PSS. In one device (line A) the emissive blend was deposited directly on to the PEDOT:PSS. In the other device (line B) a thin intermediate layer of TFB was deposited directly on to the PEDOT:PSS and the emissive blend was then deposited over that layer. FIG. 28 shows that the device having the intermediate layer of TFB was found to show significantly increased luminance at fixed voltage. This is believed to be due to the formation of a concentration gradient of the TFB component in the blend as a result of greater attraction of that component to the intermediate TFB layer than of the 5F8BT. Since the TFB is capable of acting as a hole transport/capture component in the blend it may be expected to be advantageous for that component to be more concentrated towards the hole-injecting side of the emissive layer, i.e. nearer to the interface with the PEDOT:PSS. Similar results could be expected from other methods of encouraging such a concentration gradient and from the creation of an analogous concentration gradient of any electron transport/capture component towards the electron-injecting side of the emissive layer.

As an indication of the effectiveness of the intermediate layer of TFB, table 4 shows the peak luminous efficiencies found for four device types under test:

TABLE 4

| Composition of emissive layer | Intermediate layer of TFB? | Peak luminous efficiency (lm/W) |
|---|---|---|
| 5F8BT | No | 6 |
| 5F8BT | Yes | 8 |
| 5F8BT:TFB (4:1) | No | 9 |
| 5F8BT:TFB (4:1) | Yes | 12 |

A multi-component layer of the types described above is preferably deposited as a single layer. To achieve this the components that are to make up the layer are preferably combined together before or during deposition. Such combination suitably involves forming a material that includes the components, for example by physically mixing the components together or by forming a chemical mixture by (for instance) forming molecules that incorporate one or more of the components.

One example of a material in which the components are combined chemically is a terpolymer of F8, F8BT and TFB, for example (5F8BT):TFB [80:20]. Such a material may be formed by the following method. A 500 ml r.b. flask fitted with a reflux condenser (connected to a nitrogen line) and a mechanical stirrer is charged with 9,9-dioctylfluorene-2,7-diboronic acid 1,2 ethyleneglycol diester (4.773 g, 9.0 mmol), 2,7-dibromobenzothiadiazole (0.1504 g, 0.51 mmol), 2,7-dibromo-9,9-dioctylfluorene (3.584 g, 6.54 mmol), N,N'-di-(4-bromo)phenyl-4-(sec-butyl)aniline (0.8923 g, 1.945 mmol), 90 ml of toluene, tetrakis(triphenylphosphine) palladium (31.2 mg) and 20 ml of 2 molar sodium carbonate solution. The mixture is stirred rapidly and heated at 115° C. (oil bath temperature) for up to 18 hours. A further 100 ml of toluene is added along with bromobenzene (1 ml), the mixture is then allowed to stir at temperature (115° C. oil bath temperature) for a further three hours. Phenyl boronic acid (1.5 g) is then added and the mixture is stirred at temperature for one hour and then allowed to cool to room temperature. The reaction mixture is then poured slowly into 4 l of methanol to precipitate the polymer. The polymer may then be deposited (for instance from solution) to form an emissive layer of a light-emissive device. In general, one route for formation of suitable terpolymers may be to partially react monomers providing two of the components and then to add monomers providing a third component and allow the polymerisation to continue. The copolymers could be of any appropriate form, for example random, block or branched copolymers.

Either of the charge transporting components plus the light emitting component, or both charge transporting components plus the light emitting component, may be combined in a single molecule. Where two components are combined, a copolymer is formed, while the combination of all three components may be achieved in a terpolymer. In a physical mixture of components, there might not be intimate mixing of the components due to phase separation, which might produce inefficient charge transport from either or both of the charge transporting components to the light emitting component. In a molecule that combines the charge transporting and light emitting components, these units are chemically connected and so charge transport may be expected to be facilitated compared to the physical mixture case. Molecules containing both hole transporting and light emitting components may be physically combined with an electron transporting species to produce an efficient light-emitting layer. Alternatively, molecules containing both electron transporting and light emitting components may be physically combined with a hole transporting species. If one of the electrodes is especially effective then an efficient LED structure may be produced by omitting the charge transporting component corresponding to that electrode and using for the emissive layer a two component molecule, comprising a suitable opposite charge transporting component and a light emitting component.

Two components of the emissive layer could be mixed chemically into a single molecule, and that material mixed physically with a third component provided by a second molecule.

The devices described above can be fabricated in the conventional way, by deposition of the polymer layers from solution on to a commercially-available glass/ITO substrate, followed by evaporative deposition of the cathode. As an example, the fabrication of the device of FIGS. 4 and 5 will be described in detail. First, on to a commercially-available glass/ITO substrate the BFA is deposited by spin-coating from a 0.8% concentration solution with N,N-Dimethylformamide ("DMF") as the solvent. The polymer layer is then dried by heating the sample to 80° C. under nitrogen gas for 30 minutes. Then the emissive layer is spin-coated from a 1.6% concentration solution with mixed xylene as the solvent. Targets for the thicknesses of the BFA layer and the emissive layer are 10 to 80 nm and 60 to 200 nm respectively; typical thicknesses are 65 nm and 95 nm respectively. Finally the cathode is deposited by evaporation to form a 20 nm thick layer of Li, followed by a 200 nm layer of Al. In an inert atmosphere such as nitrogen the device is encapsulated by sealing within a glass/epoxy encapsulant.

Alternative materials could be used in devices that embody the principles described above. For example, alternative materials for the anode include tin oxide ("TO") and flurinated TO; alternative materials for the hole transport layer include PEDOT:PSS and poly-aniline; alternative materials for the emissive layer include PPV and MEH-PPV; and alternative materials for the cathode include Li, Ba, Mg, Ca, Ce, Cs, Eu, Rb, K, Sm, Na, Sm, Sr, Tb and Yb; an alloy of two or more of such metals; a halide (e.g. fluoride), carbide, oxide or nitride of one or more of such metals (e.g. CsF, LiF); and an alloy of one or more of such metals together with one or more metals such as Al, Zr, Si, Sb, Sn, Zn, Mn, Ti, Cu, Co, W, Pb, In or Ag (e.g. LiAl). The cathode could be transparent. The hole transport layer could be omitted, or there could be more than one hole transport layer. There could be one or more electron transport layers between the cathode and the emissive layer, which would act to facilitate transfer of electrons from the cathode to the emissive layer and/or to block passage of holes to the cathode.

The hole transport layer could be of a mixture of materials. For instance, it could be of BFA blended with a PFM-like polymer but with solution solvency as for the BFA adjusted by the inclusion of carboxylic acid groups. Any electron transport layer could also comprise a mixture of materials, such as F8 and F8BT.

In addition to providing highly efficient blue and green emissive devices, the principles described above could be used for longer wavelength (e.g. red) emissive devices. There are polymers that are highly desirable for such devices because they have deep LUMO levels, which would allow higher workfunction and more stable metals to be used for the cathode, and high PL efficiency. However, those polymers have correspondingly deep HOMO levels. The principles described above would allow those polymers to be used despite their deep HOMO levels.

When fabricating devices with multi-component emissive layers the components can suitably be mixed together before deposition. However, to optimise the electronic effects of the components so as to exploit the principles described above it is preferred that the components in the emissive layer are partially or fully phase-separated, so that within the emissive layer there are dispersed regions of each component (see U.S. Pat. No. 5,760,791, the contents of which are incorporated herein by reference). Where movement of charge carriers from one component to another is desired, the structure of the mixed layer (especially the proportions of these components and the sizes of the regions of each) should preferably provide for adequate interfaces between those components. The regions of each component could be dispersed evenly through the layer or it may be advantageous for one or more of the components to be concentrated near one or other of the interfaces of the light-emissive layer with the charge carrier injection layers. It may be found desirable for there to be a greater concentration of a hole-injecting material at the side of the emissive layer nearer the anode (and less at the side nearer the cathode). It may be found desirable for there to be a greater concentration of an electron-injecting material at the side of the emissive layer nearer the cathode (and less at the side nearer the anode).

In order to influence the dispersion characteristics of the mixed layer (including the profile of the various components through the layer) a number of techniques may be used. The surface interactions between one or more of the components and other layers of the device (especially the layer on to which the emissive layer is deposited) may be employed to promote some degree of phase separation in the emissive layer. Preferably the deposition conditions may be arranged so that the appropriate one of the hole- or electron-transport materials is preferentially attracted to or repelled from the layer on which the emissive layer is deposited. Thus if the emissive layer is deposited on a hole-injecting anode layer then preferably the hole-injecting material is preferentially attracted to that surface and/or the electron-injecting material is preferentially repelled from the surface. The opposite preferably applies if the emissive layer is deposited on an electron-injecting cathode layer. The material of the surface on to which the emissive layer is to be deposited may be treated or selected to give rise to such preferential effects. Where two or more of the components of the emissive layer are combined in the same molecule the way in which they are combined may be used to promote a desired state of phase separation (or segregation) or uniformity. For example, the combined molecules could be synthesised as suitable random, block or branched copolymers to achieve the desired effect. Other factors relevant for phase separation include the solvent used (e.g. chloroform or xylene), the solvent vapour pressure, the molecular weight, component surface energies (relative to each other and/or to the free surface on to which the emissive layer is deposited), poly dispersity, component volume fractions, structural features etc.

The present invention may include any feature or combination of features disclosed herein either implicitly or explicitly or any generalisation thereof irrespective of whether it relates to the presently claimed invention. In view of the foregoing description it will be evident to a person skilled in the art that various modifications may be made within the scope of the invention.

The invention claimed is:

1. An electroluminescent device comprising:
   a first charge carrier injecting layer for injecting positive charge carriers;
   a second charge carrier injecting layer for injecting negative charge carriers;
   an organic light-emissive layer located between the charge carrier injecting layers; and
   a plurality of positive charge carrier transport layers located between the light emissive layer and the positive charge carrier injecting layer;
   wherein a luminescent type II heterojunction is formed between one of the positive charge carrier transport layers and the light-emissive layer;
   wherein the plurality of positive charge carrier transport layers provide a series of intermediate energy steps between the light-emissive layer and the positive charge carrier injection layer.

2. An electroluminescent device according to claim 1, wherein one or more of the positive charge carrier transport layers are organic.

3. An electroluminescent device comprising:
   a first charge carrier injecting layer for injecting positive charge carriers;
   a second charge carrier injecting layer for injecting negative charge carriers;
   an organic light-emissive layer located between the charge carrier injecting layers; and
   a plurality of positive charge carrier transport layers located between the light emissive layer and the positive charge carrier injecting layer;
   wherein a luminescent type II heterojunction is formed between one of the positive charge carrier transport layers and the light-emissive layer;
   wherein a further organic charge transporting layer is located between the light-emissive layer and the negative charge carrier injecting layers; and
   wherein the plurality of positive charge carrier transport layers provide a series of intermediate energy steps between the light-emissive layer and the positive charge carrier injection layer.

4. An electroluminescent device according to claim 1, comprising:
   a first charge carrier injecting layer for injecting positive charge carriers;
   a second charge carrier injecting layer for injecting negative charge carriers;
   an organic light-emissive layer located between the charge carrier injecting layers; and
   a plurality of positive charge carrier transport layers located between the light emissive layer and the positive charge carrier injecting layer;
   wherein a luminescent type II heterojunction is formed between one of the positive charge carrier transport layers and the light-emissive layer;
   wherein the organic light-emissive layer comprises a light-emissive component and a charge transporting component; and
   wherein the plurality of positive charge carrier transport layers provide a series of intermediate energy steps between the light-emissive layer and the positive charge carrier injection layer.

5. An electroluminescent device according to claim 4, wherein the charge transporting component is for transporting negative charge carriers.

6. An electroluminescent device according to claim 4, wherein the organic light-emissive component and the charge transporting component are provided as components of a single molecule.

7. An electroluminescent device according to claim 4, wherein the organic light-emissive component and the charge transporting component form a type II semiconductor interface.

8. A method for forming an electroluminescent device, comprising:
   depositing a first charge carrier injecting layer for injecting positive charge carriers;
   depositing an organic light-emissive layer over the first charge carrier injecting layer; and
   depositing a second charge carrier injecting layer for injecting negative charge carriers over the organic light-emissive layer,
   wherein the method comprises a further step of depositing a plurality of positive charge transport layers located between the light-emissive layer and the positive charge carrier injecting layer forming a luminescent type II heterojunction between one of the positive charge carrier transport layers and the light-emissive layer; and
   wherein the plurality of positive charge carrier transport layers provide a series of intermediate energy steps between the light-emissive layer and the positive charge carrier injection layer.

9. A method according to claim 8, wherein the organic light-emissive layer and one or more of the positive charge carrier transport layers are deposited from solution.

10. A method according to claim 9, wherein the organic light-emissive layer and one or more of the positive charge carrier transport layers are deposited together from solution and phase separate to form the organic light-emissive layer and the one or more positive charge carrier transport layers.

11. A method according to claim 9, wherein the organic light-emissive layer and one or more of the positive charge carrier transport layers are deposited in separate deposition steps.

12. A method according to claim 8, wherein one or more of the positive charge carrier transport layers are organic.

13. A method for forming an electroluminescent device, comprising:
   depositing a first charge carrier injecting layer for injecting positive charge carriers;
   depositing an organic light-emissive layer over the first charge carrier injecting layer; and
   depositing a second charge carrier injecting layer for injecting negative charge carriers over the organic light-emissive layer;
   wherein the method comprises a further step of depositing a plurality of positive charge transport layers located between the light-emissive layer and the positive charge carrier injecting layer forming a luminescent type II heterojunction between one of the positive charge carrier transport layers and the light-emissive layer;

wherein a further organic charge transporting layer is disposed between the light emissive layer and the negative charge carrier injecting layer; and wherein the plurality of positive charge carrier transport layers provide a series of intermediate energy steps between the light-emissive layer and the positive charge carrier injection layer.

14. A method according to claim 8, for forming an electroluminescent device, comprising:

depositing a first charge carrier injecting layer for injecting positive charge carriers;

depositing an organic light-emissive layer over the first charge carrier injecting layer; and depositing a second charge carrier injecting layer for injecting negative charge carriers over the organic light-emissive layer, wherein the method comprises a further step of depositing a plurality of positive charge transport layers located between the light-emissive layer and the positive charge carrier injecting layer forming a luminescent type II heterojunction between one of the positive charge carrier transport layers and the light-emissive layer, and wherein the organic light-emissive layer comprises a light-emissive component and a charge transporting component.

15. A method according to claim 14, wherein the charge transporting component is for transporting negative charge carriers.

16. A method according to claim 14, wherein the organic light-emissive component and the charge transporting component are provided as components of a single molecule.

17. A method according to claim 14, wherein the organic light-emissive component and the charge transporting component form a type II semiconductor interface.

* * * * *